(12) United States Patent
Popa et al.

(10) Patent No.: US 8,741,737 B2
(45) Date of Patent: Jun. 3, 2014

(54) THREE-DIMENSIONAL WAFER STACKING WITH VERTICAL INTERCONNECTS

(75) Inventors: Dan O. Popa, Arlington, TX (US); Rachita Dewan, Washington, DC (US); Praveen Pandojirao-Sunkojirao, Arlington, TX (US); Jung-Chih Chiao, Grand Prairie, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1202 days.

(21) Appl. No.: 11/858,753

(22) Filed: Sep. 20, 2007

(65) Prior Publication Data

US 2008/0122115 A1     May 29, 2008

Related U.S. Application Data

(60) Provisional application No. 60/846,080, filed on Sep. 20, 2006.

(51) Int. Cl.
*H01L 21/30* (2006.01)

(52) U.S. Cl.
USPC ........... 438/455; 438/597; 438/598; 438/669; 438/670; 438/671

(58) Field of Classification Search
USPC .................. 438/455, 597, 598, 669, 670, 671
See application file for complete search history.

(56) References Cited

U.S. PATENT DOCUMENTS

2007/0072330 A1    3/2007  Popa et al.

OTHER PUBLICATIONS

Praveen Pandojirao-Sunkojirao, et al., "BCB Wafer Bonding with Electrical Interconnects," SMTA IWLPC 3D Wafer-Scale Conference, Nov. 2006, San Jose US.

Praveen Pandojirao-Sunkojirao, et al., "Electrical Interconnects for 3D Wafer Stacks," IMAPS International Conference and Exhibition on Device Packaging, Mar. 2006, Scottsdale US.

Rachita Dewan, "3D Interconnects for Die and Wafer Stacks," UT Arlington M.S. Thesis, Aug. 2006, Arlington US.

John Baliga, "Yet Another Way to Use BCB," Semiconductor International Online, Jul. 2006.

Abiodun A. Fasoro et al., "Die and Wafer-Level Hermetic Sealing for MEMS Applications," Proceedings of IPACK2007, ASME InterPACK '07, Jul. 8-12, 2007, Vancouver, British Columbia, Canada.

Tae-Joo Hwang et al., "Formation of Micro-Channels by Patterning of BCB, Bulk Micro-Machining and Wafer Bonding," Rensselaer Office of Technology Commercialization, http://www.rpitechnology.com.

Praveen Pandojirao-Sunkojirao et al., "Formation of Electrical Interconnects for 3D Wafer Stacks," the VII International Conference on Micro Electro Mechanical Systems, Sep. 21-22, 2005, El Paso, Tx, USA and Ciudad Juarez, Mexico.

Praveen Pandojirao-S et al., "Progress on Wafer Scale Integration using BCB and Solder Microbumps," TEXMEMS, The VIII International Conference on Micro Electro Mechanical Systems, Oct. 2006.

*Primary Examiner* — Samuel Gebremariam
(74) *Attorney, Agent, or Firm* — Crowdhury & Georgakis, P.C.

(57) ABSTRACT

Described are three-dimensional stacked semiconductor structures having one or more vertical interconnects. Vertical stacking relies on vertical interconnects and wafer bonding using a patternable polymer. The polymer is preferably lithographically patternable and photosensitive. Curing of the polymer is preselected from about 35% to up to about 100%, depending on a desired outcome. When fabricated, such vertically stacked structures include electrical interconnects provided by solder reflow. Solder reflow temperature is bounded by a curing and glass transition temperatures of a polymer used for bonding.

30 Claims, 22 Drawing Sheets

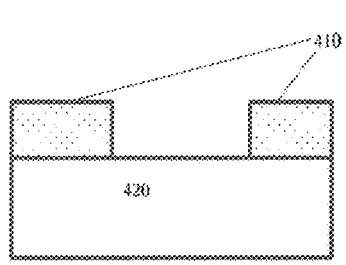
FIG. 4A
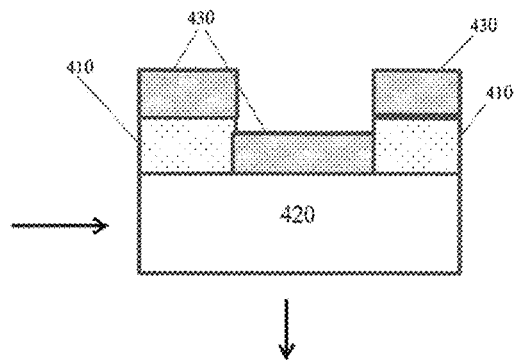
FIG. 4B

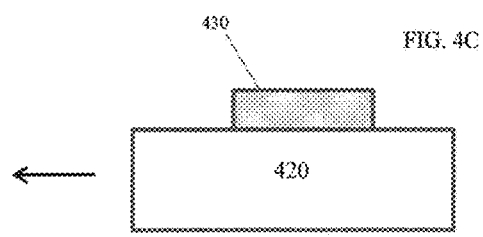
FIG. 4C
FIG. 4E
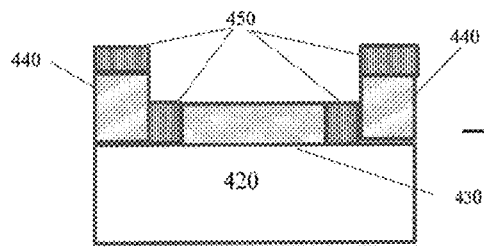
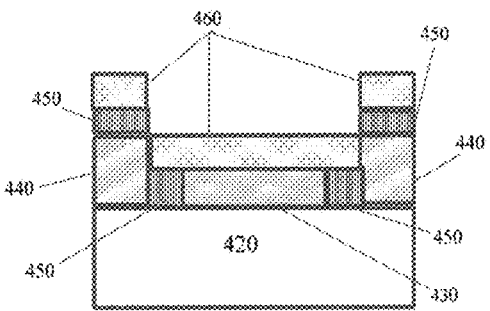
FIG. 4F
FIG. 4H
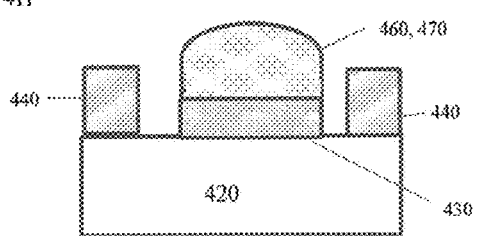
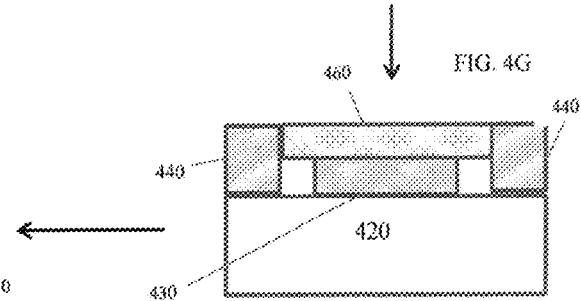
FIG. 4G FIG. 6A
FIG. 6B
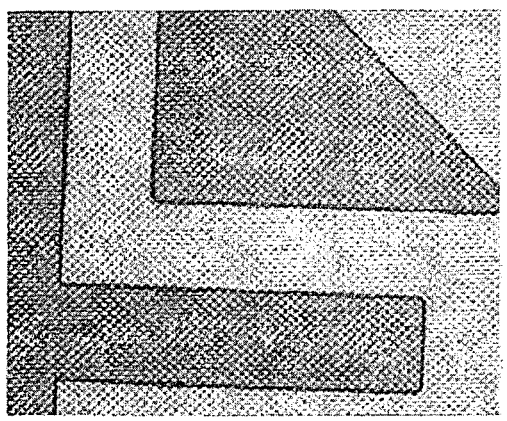
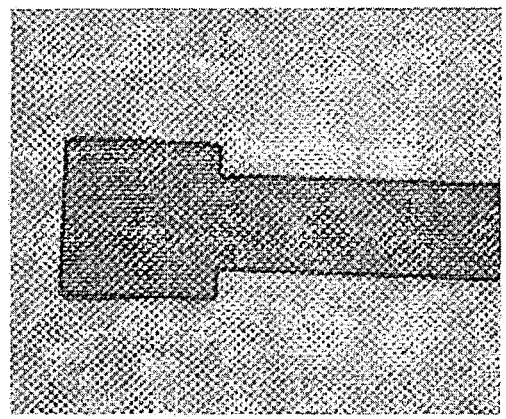

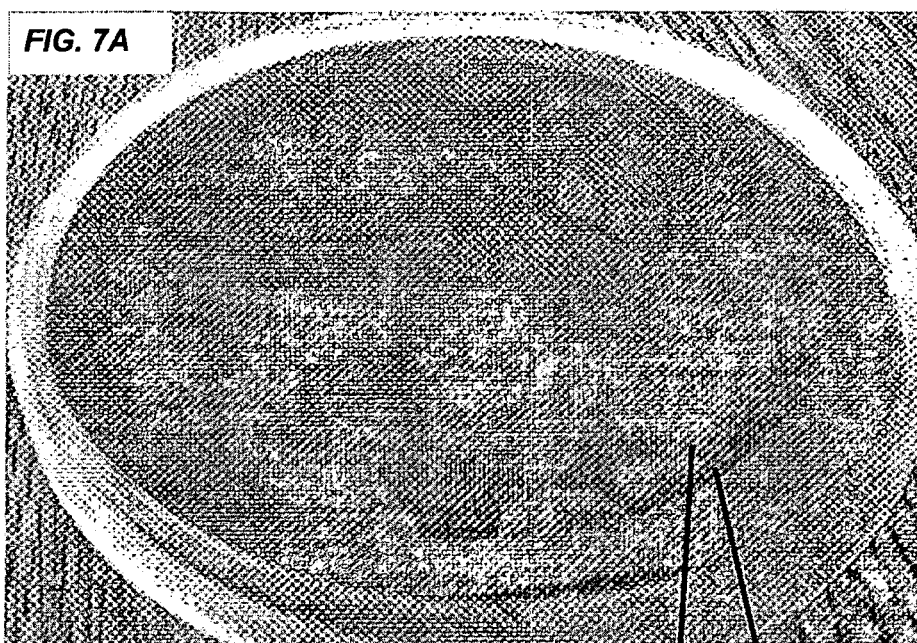
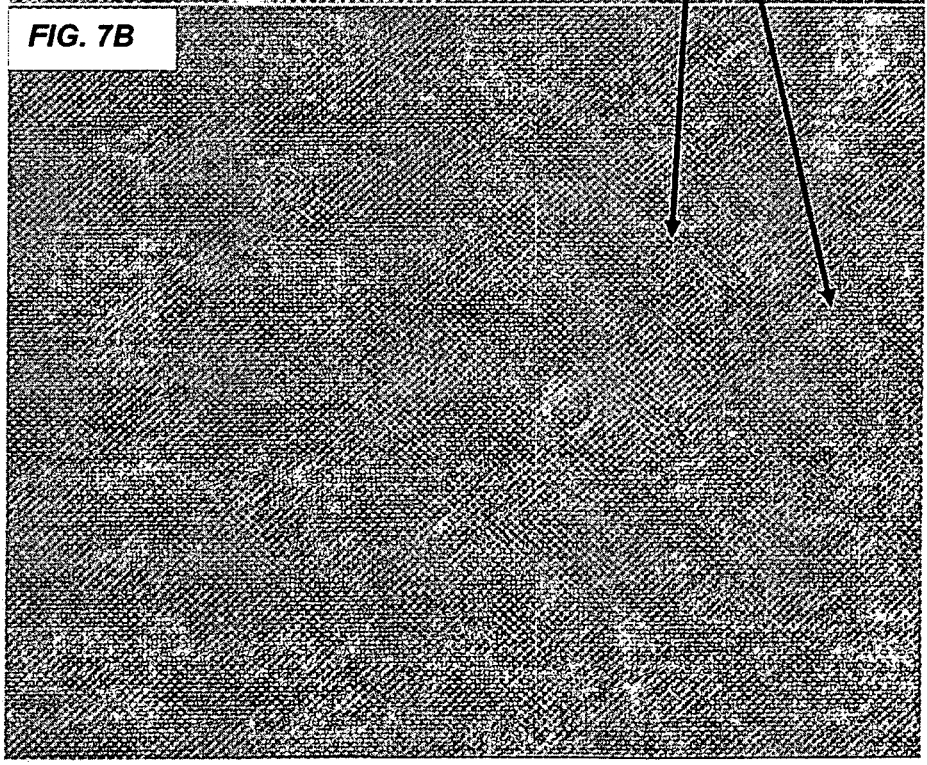

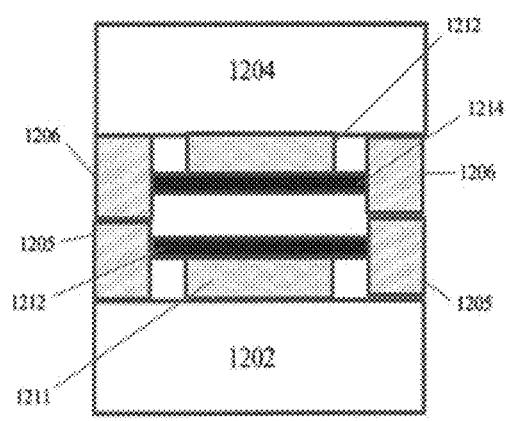
*FIG. 12*
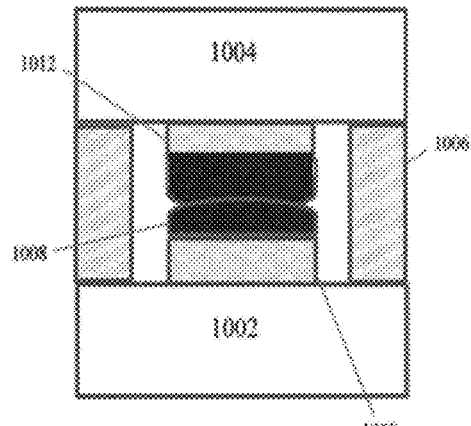
*FIG. 10*
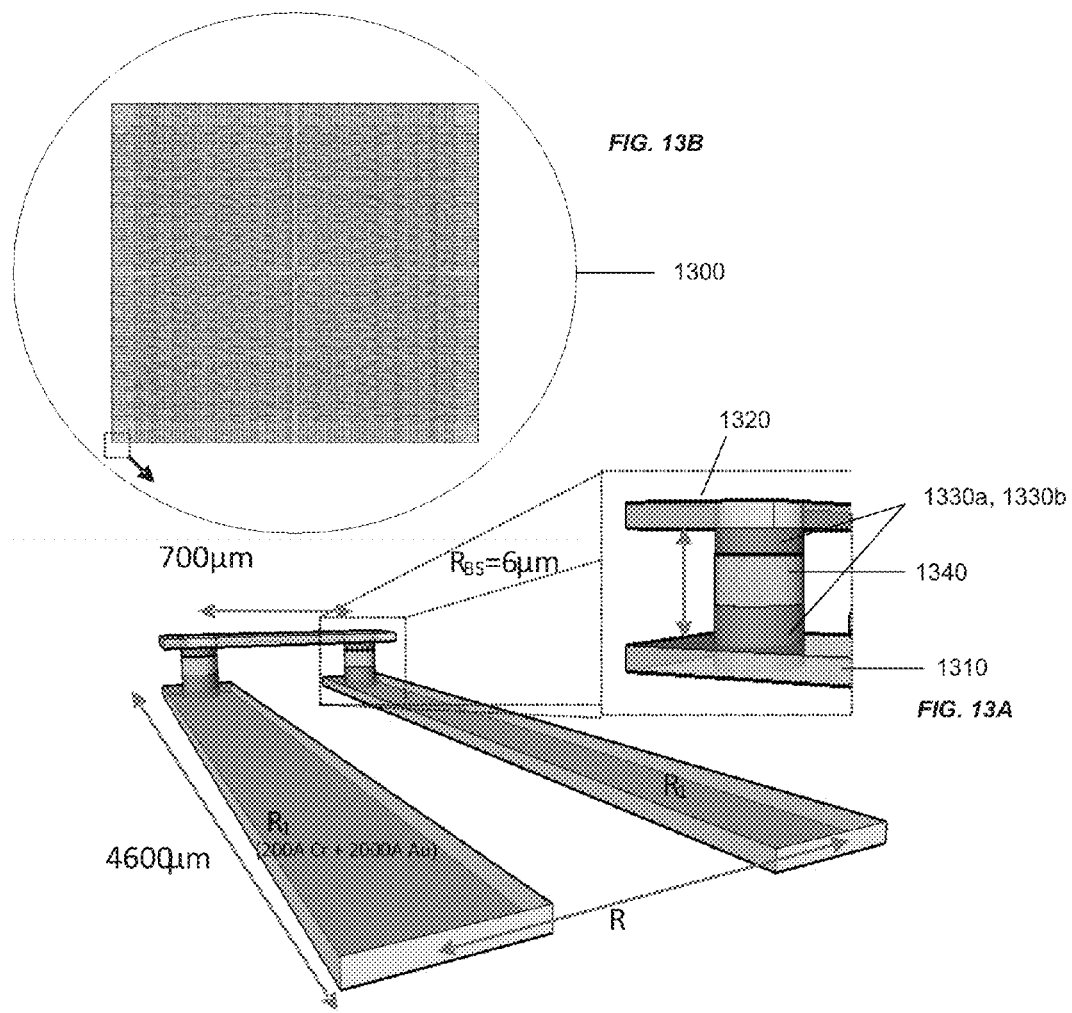
*FIG. 13B*
*FIG. 13A*

FIG. 16

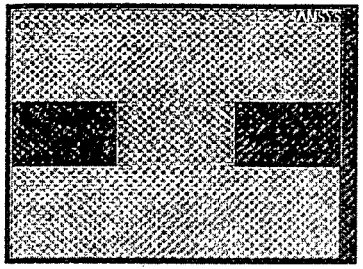

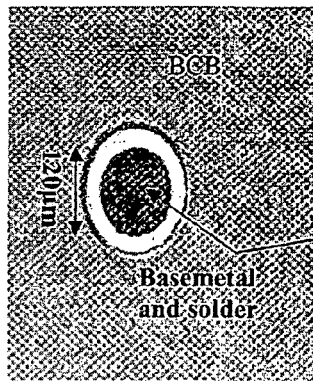

FIG. 13C

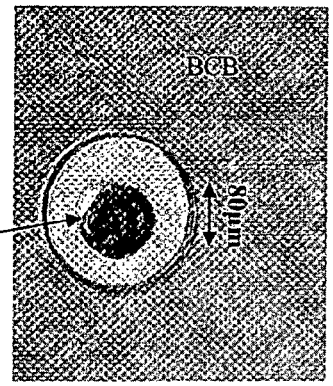

|  | Resistance (ohms) |  | Resistance (ohms) |
| --- | --- | --- | --- |
| Pads 1 and 2 | 120.0719091 | Pads 1 and 22 | 373.2527273 |
| Pads 1 and 3 | 133.4985455 | Pads 1 and 23 | 394.225 |
| Pads 1 and 4 | 145.3549091 | Pads 1 and 24 | 400.6790909 |
| Pads 1 and 5 | 155.4507273 | Pads 1 and 25 | 421.8159091 |
| Pads 1 and 6 | 148.5662727 | Pads 1 and 26 | 412.7295455 |
| Pads 1 and 7 | 148.5492727 | Pads 1 and 27 | 424.0287273 |
| Pads 1 and 8 | 182.516 | Pads 1 and 28 | 436.4250909 |
| Pads 1 and 9 | 190.1855455 | Pads 1 and 29 | 446.5361818 |
| Pads 1 and 10 | 198.2881818 | Pads 1 and 30 | 451.5304545 |
| Pads 1 and 11 | 208.9227273 | Pads 1 and 31 | 483.2581818 |
| Pads 1 and 12 | 240.6146273 | Pads 1 and 32 | 492.9495455 |
| Pads 1 and 13 | 262.1563636 | Pads 1 and 33 | 502.1600909 |
| Pads 1 and 14 | 234.4849091 | Pads 1 and 34 | 496.5934545 |
| Pads 1 and 15 | 244.6220909 | Pads 1 and 35 | 518.2903636 |
| Pads 1 and 16 | 292.3858182 | Pads 1 and 36 | 565.9435455 |
| Pads 1 and 17 | 298.8749091 | Pads 1 and 37 | 565.4174545 |
| Pads 1 and 18 | 288.3048182 | Pads 1 and 38 | 569.0449091 |
| Pads 1 and 19 | 296.1806364 | Pads 1 and 39 | 556.2554545 |
| Pads 1 and 20 | 341.7954545 | Pads 1 and 40 | 553.1125455 |
| Pads 1 and 21 | 359.7949091 |  |  |

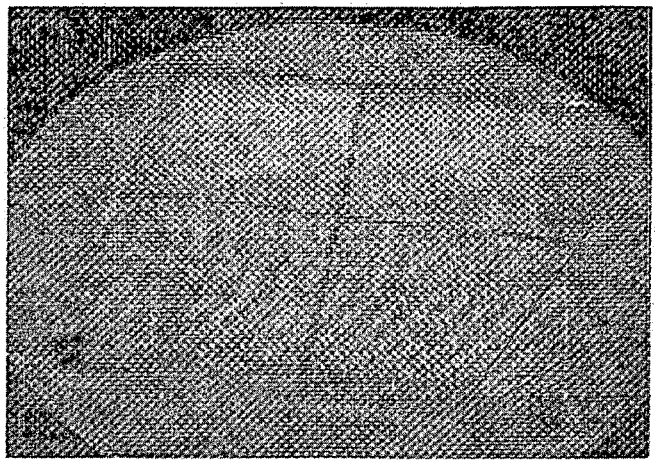 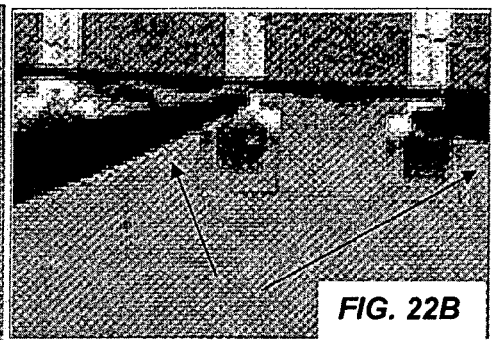
FIG. 22A
FIG. 22B
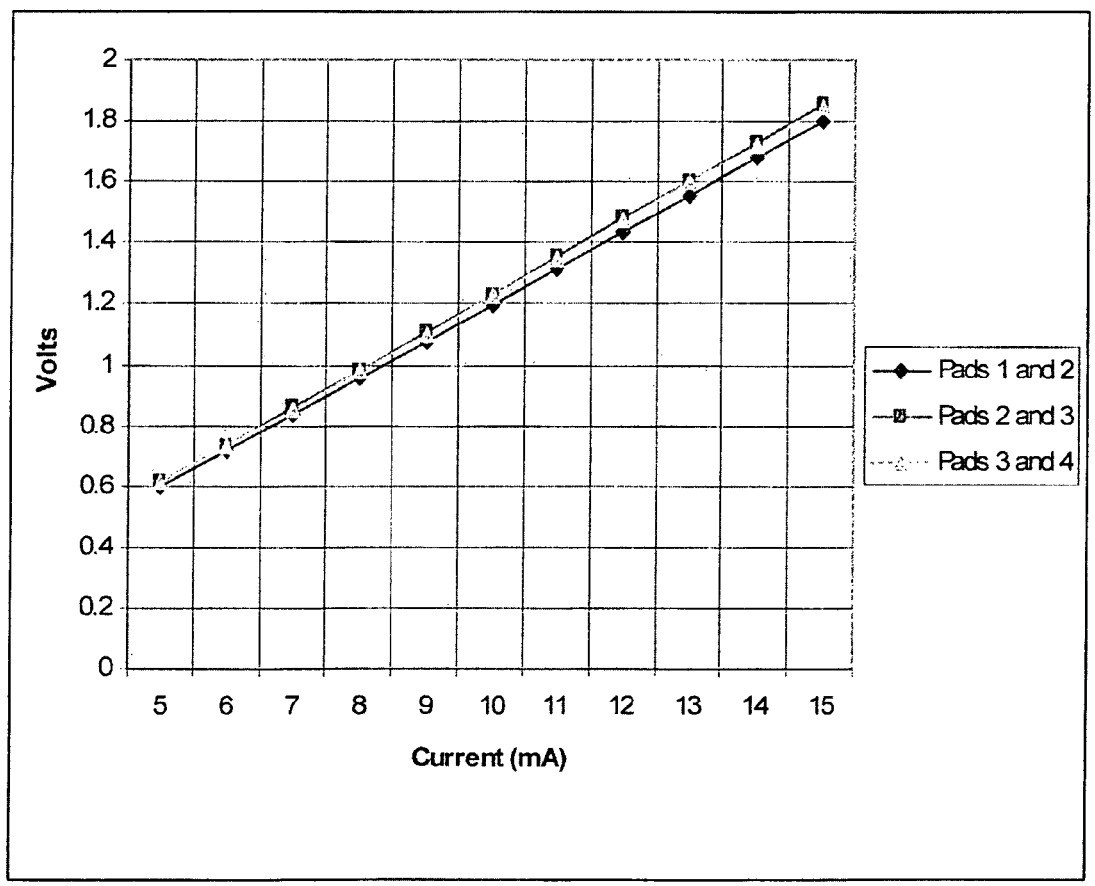
FIG. 23

*FIG. 24*

| Current (mA) | Pads 1 and 2 (volts) | Pads 1 and 3 (volts) | Pads 1 and 4 (volts) | Pads 1 and 5 (volts) | Pads 1 and 6 (volts) |
|---|---|---|---|---|---|
| 5 | 0.60103 | 0.6783 | 0.73995 | 0.79345 | 0.74472 |
| 6 | 0.7187 | 0.80864 | 0.88424 | 0.9479 | 0.89224 |
| 7 | 0.83678 | 0.9407 | 1.02813 | 1.10231 | 1.0406 |
| 8 | 0.95515 | 1.0729 | 1.17401 | 1.25654 | 1.18664 |
| 9 | 1.0731 | 1.2064 | 1.31765 | 1.41163 | 1.3362 |
| 10 | 1.1941 | 1.3391 | 1.46324 | 1.56695 | 1.48372 |
| 11 | 1.3139 | 1.4745 | 1.60943 | 1.72234 | 1.63118 |
| 12 | 1.4355 | 1.6072 | 1.75487 | 1.87841 | 1.78151 |
| 13 | 1.5576 | 1.7417 | 1.89979 | 2.03475 | 1.931 |
| 14 | 1.6791 | 1.8773 | 2.04688 | 2.19164 | 2.08167 |
| 15 | 1.8015 | 2.0124 | 2.19395 | 2.34802 | 2.23045 |
| Resistance = (ohms) | 122.6043 | 133.4985 | 145.3549 | 155.4507 | 148.5663 |

| Current (mA) | Pads 1 and 7 (volts) | Pads 1 and 8 (volts) | Pads 1 and 2 (volts) | Pads 1 and 9 (volts) | Pads 1 and 10 (volts) |
|---|---|---|---|---|---|
| 5 | 0.74769 | 0.93301 | 0.97021 | 1.01461 | 1.06657 |
| 6 | 0.89203 | 1.112 | 1.15825 | 1.21223 | 1.27778 |
| 7 | 1.03961 | 1.29512 | 1.34614 | 1.41248 | 1.48376 |
| 8 | 1.18725 | 1.47759 | 1.53659 | 1.60785 | 1.69264 |
| 9 | 1.33547 | 1.65701 | 1.72574 | 1.80558 | 1.89941 |
| 10 | 1.48257 | 1.84027 | 1.91513 | 2.00214 | 2.10904 |
| 11 | 1.63264 | 2.02405 | 2.10757 | 2.2008 | 2.31983 |
| 12 | 1.78172 | 2.20574 | 2.29735 | 2.4019 | 2.52752 |
| 13 | 1.93125 | 2.38864 | 2.48751 | 2.5995 | 2.73625 |
| 14 | 2.07964 | 2.57469 | 2.68125 | 2.79831 | 2.94703 |
| 15 | 2.23348 | 2.75743 | 2.8704 | 2.99921 | 3.15794 |
| Resistance = (ohms) | 148.5493 | 182.516 | 190.1855 | 198.2882 | 208.9227 |

THREE-DIMENSIONAL WAFER STACKING WITH VERTICAL INTERCONNECTS

I. CROSS-REFERENCES TO RELATED APPLICATION

This application claims priority to U.S. Provisional Patent Application Ser. No. 60/846,080, filed Sep. 20, 2006.

II. STATEMENT REGARDING FEDERALLY SPONSORED RESEARCH OR DEVELOPMENT

Not applicable.

III. BACKGROUND OF THE INVENTION

As described, the invention relates generally to the field of wafer fabrication and compositions formed therefrom.

While conventional fabrication methods for semiconductor substrates are two-dimensional, such structures have several disadvantages, including high power consumption (parasitic capacitance), long delay (via interconnection lengths), size and weight limitations, increased noise, and larger footprints. Fabrication in three-dimensions includes formation of vertical electrical interconnects. Current fabrication methods—of which there are two—rely on complicated and inefficient processes. The first method involves first bonding wafers vertically and then thinning said wafers followed by deep reactive ion etching (DRIE) of the wafers through the stack and finally deposition (plating) of an interconnect metal. The second method relies on formation of solder bumps as interconnects before bonding; typically interconnects are formed by a traditional flip-chip process. Stacked wafers are then filled by an underfill material (resin with fillers) to prevent thermal expansion and failure. The entire process, however, is only possible when interconnects are large (typically 50 microns or more in diameter and height).

IV. SUMMARY OF THE INVENTION

The invention includes a new type of semiconductor fabrication process that relies on three-dimensional stacking of suitable substrates to provide benefits not available with two-dimensional fabrication methods or current three-dimensional fabrication methods.

As described herein, one or more embodiments of the present invention include three-dimensional stacked semiconductor structures having one or more vertical interconnects. When fabricated, the three-dimensional stacked semiconductor structures provide for and include electronic components, such as radio frequency and/or wireless circuits, sensors, microfluidic circuits, control circuits and the like.

Vertical stacking described herein relies on vertical interconnects and wafer bonding using a patternable polymer, such as benzocyclobutene (BCB). In one or more embodiments, the polymer is lithographically patternable and is photosensitive. Such embodiments provide advantages previously unavailable to semiconductor structures, such as variable curing conditions and variable positioning of the polymer. Curing may be preselected from at or about 35% to up to 100% depending on a desired outcome. Polymer position may be preselected (e.g., screen printing, corner bonding, jet dispensing) and preselection may aid in overall manufacturing in order to avoid loss of an entire assembly if there is only one defective position and/or structure.

The vertical interconnects described herein are typically provided by solder reflow. In one or more embodiments, the vertical interconnects are provided via one or more conducting metal or metal alloys preselected at a desired reflow temperature. Height after reflow may be varied as desired; the interconnects reach heights as high as 4 microns. Reflow temperature is typically compatible with thermal bonding to provide for simultaneous processing steps. Solder reflow temperature is bounded by a curing and glass transition temperatures of the polymer used as a bond layer.

Processes described herein do not require an underfill material with fillers that prevent adhesion nor do they require pre-bake to remove moisture and bubbles. Structures and devices formed from such processes may be reworkable. In addition, with the absence of an underfill, for electronic structures and devices herein, a chip component may be placed much closer to an active component than previously available.

Those skilled in the art will further appreciate the above-noted features and advantages of the invention together with other important aspects thereof upon reading the detailed description that follows in conjunction with the drawings.

V. BRIEF DESCRIPTION OF THE FIGURES

For more complete understanding of the features and advantages of the present invention, reference is now made to the detailed description of the invention along with the accompanying figures, wherein:

FIGS. 6A and 6B depict representative patterning as provided on a polymer glue described herein, in accordance with one or more embodiments of the present invention;

FIG. 7A depicts representative wafer bonding at 500 N and 1000 N pressure, in accordance with one or more embodiments of the present invention;

FIG. 7B depicts a representative microscope image showing no reflow in FIG. 7A, in accordance with one or more embodiments of the present invention;

FIG. 10 depicts a representative vertically stacked structure after bonding and reflow, in accordance with one or more embodiments of the present invention;

FIG. 12 depicts a representative vertically stacked structure after bonding, in accordance with one or more embodiments of the present invention;

FIG. 13A depicts in schematic form a bonded 4-inch wafer with 1600 interconnects per quadrant, in accordance with one or more embodiments of the present invention;

FIG. 13B depicts in schematic form a diagram showing metal contact pads of a wafer of FIG. 13A, in accordance with one or more embodiments of the present invention;

FIG. 13C and FIG. 13D depicts optical microscope image of a solder described herein (C) before and (D) after reflow, in accordance with one or more embodiments of the present invention;

Figure 17:
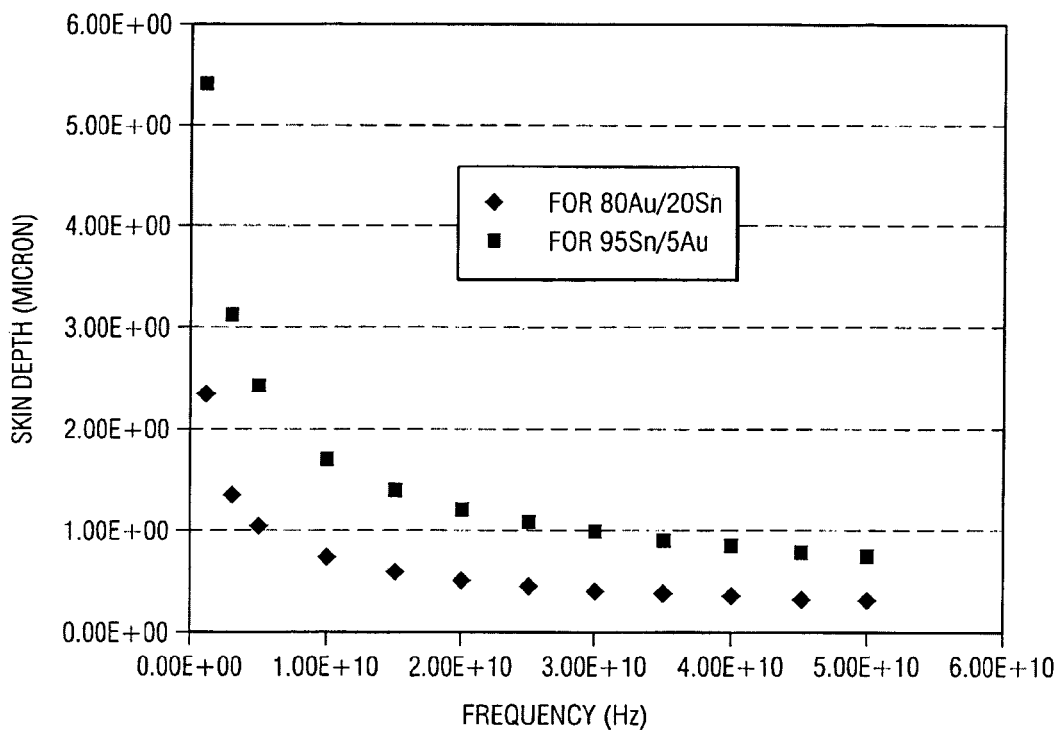
Figure 20:
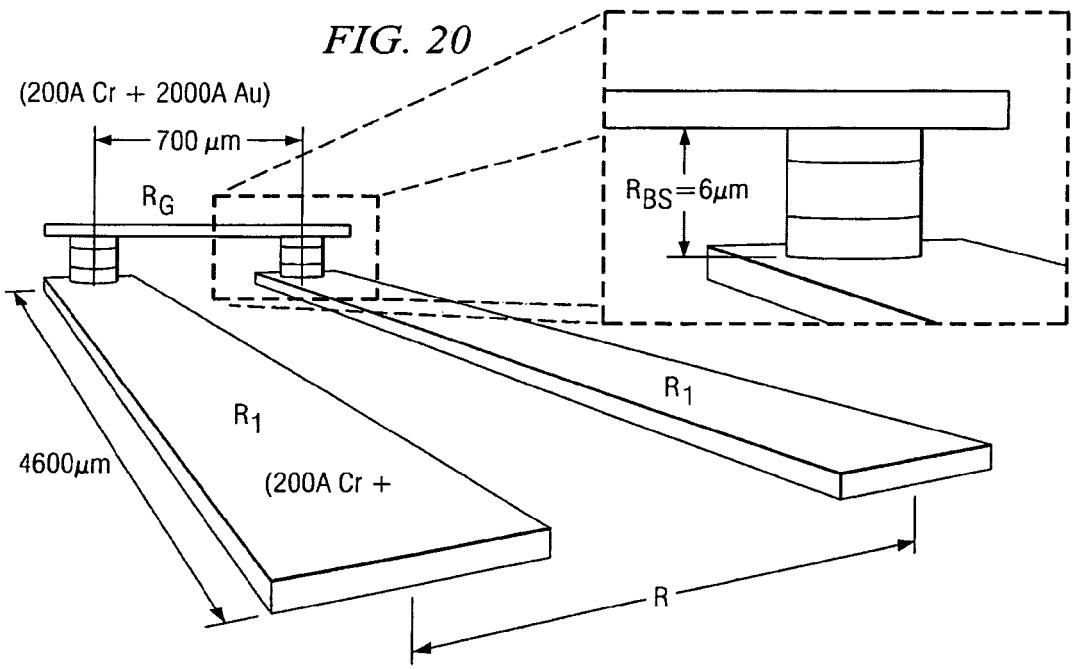
Figure 18:
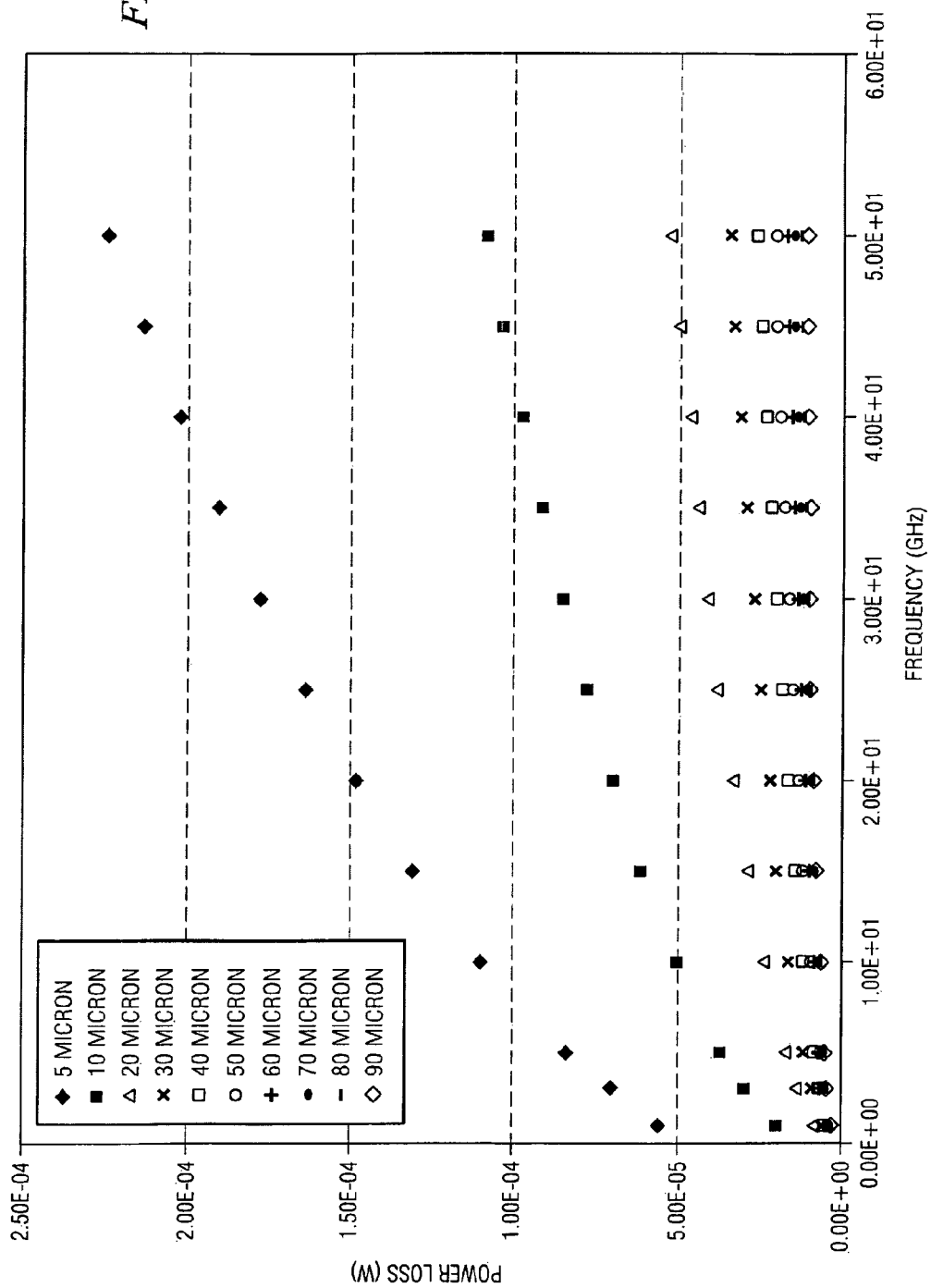
Figure 19:
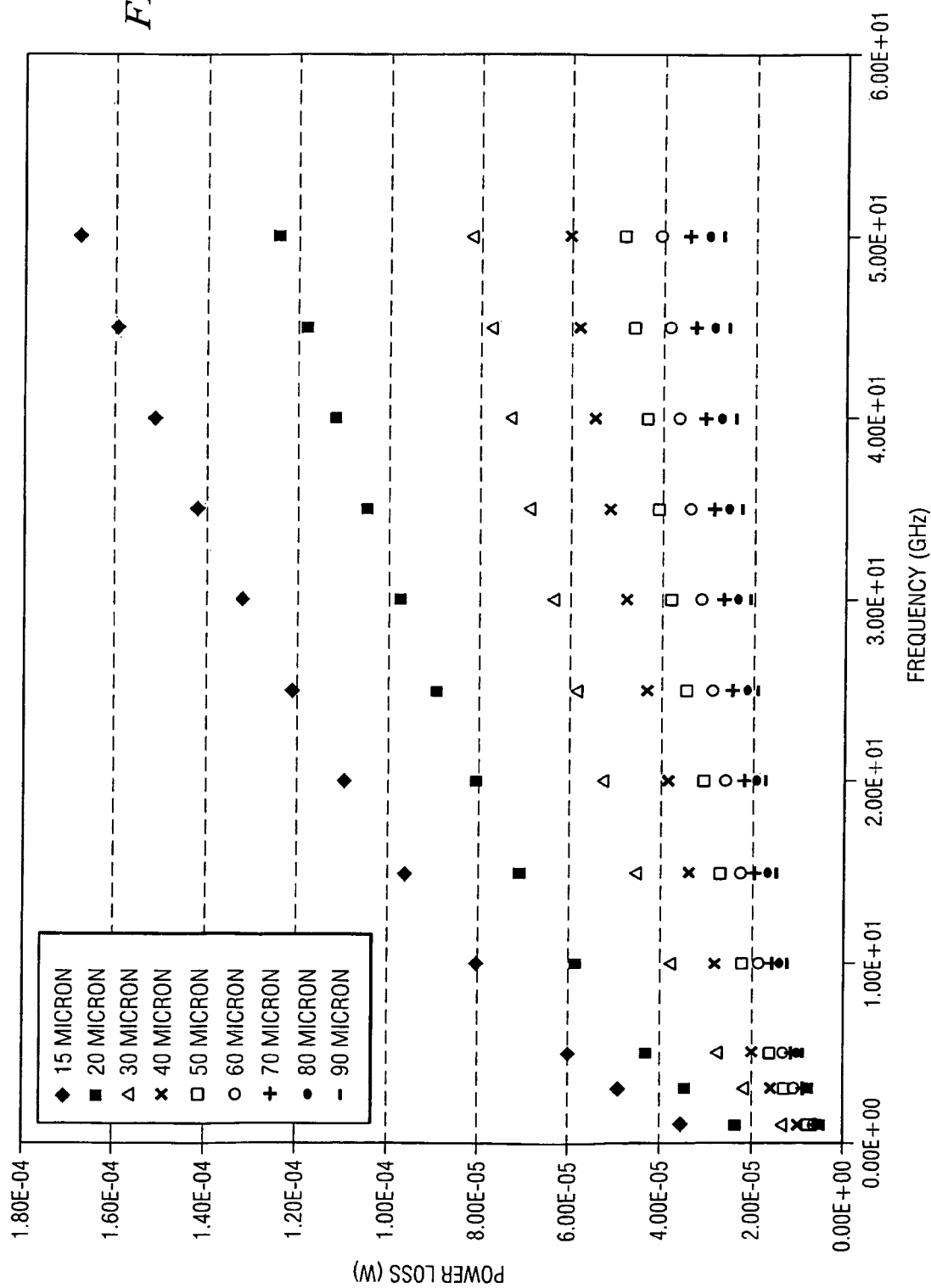
Figure 21:
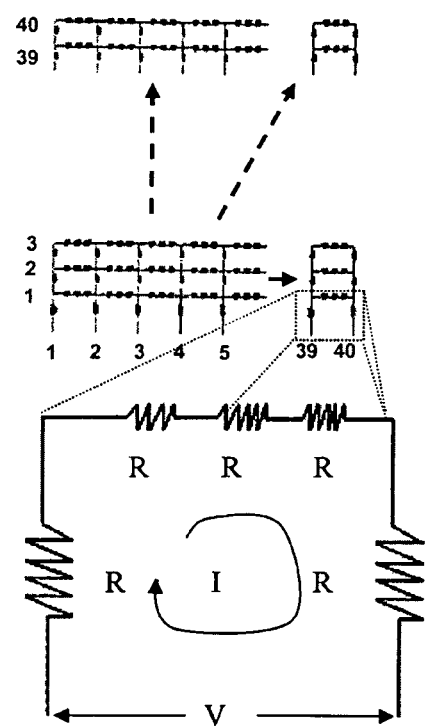
Figure 25:
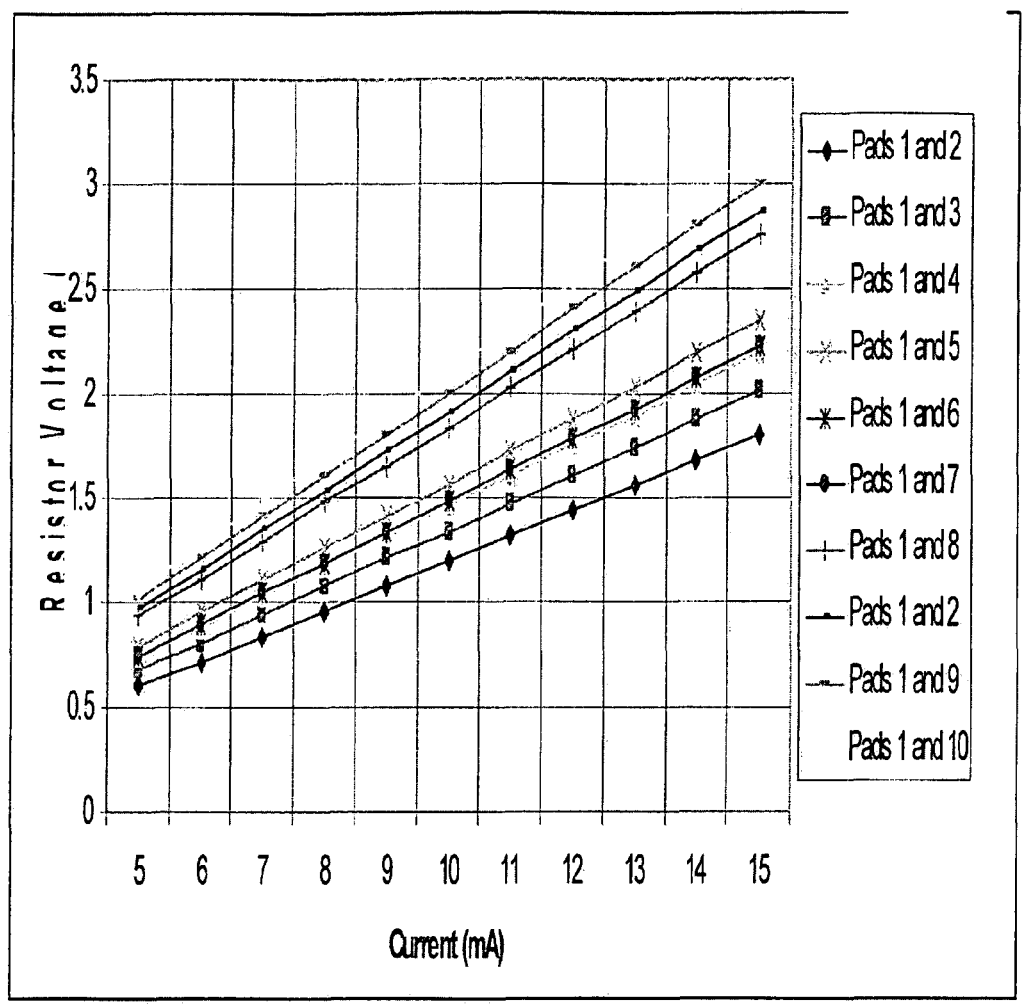
Figure 26:
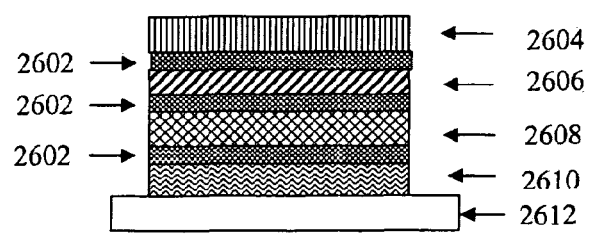

FIG. 15 Experimental results showing the resistance measurement between contact-FIG. 16 depicts a 3D model of interconnect using an engineering design analysis software, in accordance with one or more embodiments of the present invention;

FIG. 17 depicts a plot of skin depth versus frequency for interconnects described herein, in accordance with one or more embodiments of the present invention;

FIG. 18 depicts power losses versus frequency for different interconnect diameters described herein, in accordance with one or more embodiments of the present invention;

FIG. 19 depicts power losses versus frequency for various interconnects as described herein, in accordance with one or more embodiments of the present invention;

FIG. 20 depicts in schematic form the metal line, base metal and solder as described herein, in accordance with one or more embodiments of the present invention;

FIG. 21 depicts an electrical equivalent circuit of FIG. 20, in accordance with one or more embodiments of the present invention;

FIG. 22A depicts a representative wafer diced to exposed contact pads for electrical testing, in accordance with one or more embodiments of the present invention;

FIG. 22B depicts probe tips on two exposed contact pads of FIG. 22A, in accordance with one or more embodiments of the present invention;

FIG. 23 depicts representative resistance measurements between first three consecutive pad pairs as described herein, in accordance with one or more embodiments of the present invention;

FIG. 24 depicts V-I measurements between pad pairs, in accordance with one or more embodiments of the present invention;

FIG. 25 depicts representative resistance measurements between a first pad and the remaining pads, in accordance with one or more embodiments of the present invention; and FIG. 26 depicts an example of a vertically stacked structure of multiple microsystems (more than two wafer/substrate units), in accordance with one or more embodiments of the present invention.

VI. DETAILED DESCRIPTION OF THE INVENTION

The invention, as defined by the claims, may be better understood by reference to the following detailed description. The description is meant to be read with reference to the figures contained herein. This detailed description relates to examples of the claimed subject matter for illustrative purposes, and is in no way meant to limit the scope of the invention. The specific aspects and embodiments discussed herein are merely illustrative of ways to make and use the invention, and do not limit the scope of the invention.

Three dimensional (3D) bonding of semiconductor surfaces is important for packaging efficient electronics and micro-electro-mechanical systems (MEMS). For example, bonding of several wafers containing MEMS, micro fluidics, and/or semiconductor integrated circuits, allows one to create functional wafer-scale microsystems. To realize the potential of 3D wafer stacking, electrical and fluidic interconnects must be coordinated between wafers. Described herein are improved ways to form electrical interconnects between semiconductor substrates, such as wafers, that includes forming vertical interconnects via solder bumps coordinated with bonding of said substrates.

Generally, in one or more embodiments, solder bumps are formed through a deposition process that includes evaporation of alternate layers of one or more conducting metals or by sputtering of the conducting metal. The conducting metal (solder material) includes a metal or metal alloy and is typically lead-free. An especially useful thickness of the solder material is one that is less than the thickness of the bond layer. However, additional and varied thicknesses may be applied. Solder reflow temperature is bounded by a curing and glass transition temperatures of a polymer used as a bond layer.

In various preferred embodiments, small solder bumps are achieved by depositing alternating layers of a plurality of different conducting metals in appropriate proportions to form a metal alloy. The conducting metal alloy is positioned on top of a base metal pad. Oxide formation (of the conducting metal alloy) is inhibited by depositing another metal as a top layer, thus reflow is not affected at a solder joint. Advantageously, process flows described herein includes known processes, such as photolithography, lift-off, e-beam deposition, thermal evaporation, reflow, alignment and/or bonding a wafer bonder, to provide for high throughput.

A conducting metal useful herein for soldering includes one that is malleable, ductile and/or highly crystalline. Representative examples include tin (Sn), gold (Au), copper (Cu), bismuth (Bi), indium (In), silver (Ag). While a popular metal alloy for soldering is Sn—Au when used as eutectic 80% Au and 20% Sn because this has been known to have very good creep and fatigue resistance, the eutectic 80% Au and 20% Sn metal alloy is unfortunately a hard solder and has a higher melting temperature (280 degrees Centigrade [C]).

For processes described herein, lower temperature metals are preferred. In one or more embodiments, a chosen conducting metal is one having a solder reflow temperature that is bounded between a curing temperature and glass transition temperatures of a bonding layer also provided herein, the bonding layer formed from a patternable polymer. One preferred polymer is BCB having a curing temperature of less than about 250 degrees C. and a glass transition temperature of over 350 degrees C. Other patternable polymers with suitable separations in curing temperature and glass transition temperature may also be used. Preferably, such polymers are patternable by lithography and are photosensitive.

Several representative conducting metals useful with processes described herein are provided in TABLE 1A, which also shows the coordinated melting and reflow temperatures for such conducting metals (provided as metal combinations). TABLE 1A is illustrative of metals with properties that achieve the desired processes described herein. Not all conducting metals or metal combinations and possible ratios are shown; other solders, typically referred to as soft solders, are contemplated and will be useful.

TABLE 1A

| Metal | Ratio | Melting Temp. | Reflow Temp. |
|---|---|---|---|
| Sn/Au | 95/05 | 217 | 230 |
| Sn/Au | 20/80 | 217 | 280-310 |
| Sn/Cu | 92.3/0.7 | 227 | 245-257 |
| Sn/Ag (E) | 96.5/3.5 | 221 | 245-255 |
| Sn/Ag/Cu | 95.5/3.8/0.7 | 217 | 240-250 |
| Sn/Ag/Bi | 91.7/3.5/4.8 | 205-210 | 240-250 |
| Sn/Ag/In | 95/3.5/1.5 | 218 | 240-250 |
| Sn/Ag | 90/10 | 221 | 240-250 |

A plurality of solder bumps as described herein and formed by a conducting metal are provided either by alloy sputtering or by evaporation of alternate layers of a first and second metal in the appropriate proportions. Soldering 50 is formed on top of a base metal pad 30 as depicted in FIG. 1. Examples of representative embodiments are further illustrated with TABLE 1B.

TABLE 1B

| Solder composition | Deposition method | Layer deposition |
|---|---|---|
| 95% Sn/5% Au | layer sputtering | two depositions of 600 nm Sn + 20 nm Au |
| 80% Au/20% Sn | alternating layer sputtering | 500 nm Sn + 733.25 nm Au |

A representative process for providing a base metal interconnect and a solder bump is depicted in FIG. 1. The process includes spin coating, optionally patterning and developing a suitable a positive, first photoresist 10 on a silicon-containing substrate 20 (e.g., silicon or glass wafer) (FIG. 1A). In FIG. 1B, a base metal 30 is deposited. The base metal 30 must provide appropriate adhesion to the silicon-containing substrate 20 and will not dissolve or diffuse in a solder metal 50, to be deposited. Examples of suitable base metals 30 are titanium (Ti), platinum (Pt) and chromium (Cr). The first photoresist 10 is subsequently lifted off (FIG. 1C), after which a second photoresist 40 is provided, optionally patterned and developed (FIG. 1D). In FIG. 1E, the solder metal 50 is deposited. In various preferred embodiment, alternative layers of one or more solder metals 50 are deposited. In other embodiments, a single solder metal 50 provided as a metal alloy is deposited to a desired thickness. In FIG. 1F, the second photoresist 40 is lifted off and solder reflow is performed.

The base metal 30 also helps define the solder reflow area and isolates the solder metal 50 from melting the surroundings. When depositing a conducting metal as solder metal 50, a desired solder composition may be achieved by evaporating alternate layers of desired metals using either electron beam (E-beam) or a thermal evaporator. With solder reflow, a total thickness of the deposited solder metal 50 is typically about 5 μm or less.

In several examples, a Sn-rich alloy with a composition of 95% Sn and 5% Au was used as the solder metal 50; the melting temperature of this combination is about 217 degrees C. and, experimentally, its reflow temperature is about 230 degrees C. Composition of the solder metal 50 was achieved by evaporating in alternate layers, Sn (at about 0.6 μm) and Au (about 0.02 μm). The total thickness of the deposited solder metal 50 was 1.24 μm. The base metal layer 30 could be varied and defined the solder reflow area as well as isolating the solder metal 50 from melting the silicon-containing substrate 20. In one example, the base metal 30 was Ti (100 nm), Pt (100 nm) and Au (100 nm). Reflow characteristics of a Sn/Au solder metal 50 were determined.

Figure 1A:
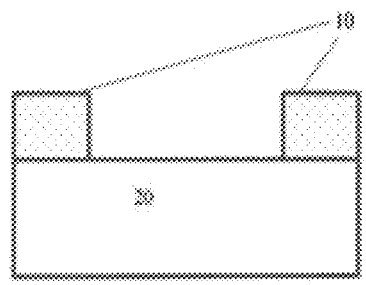
FIGS. 1A-1F depict a representative process flow for soldering as described herein, in accordance with one or more embodiments of the present invention.
Figure 1B:
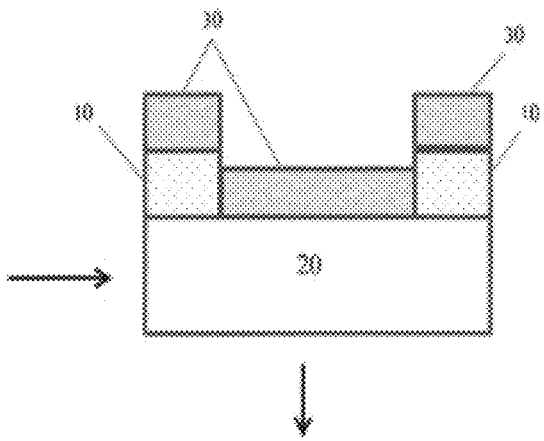
Figure 1D:
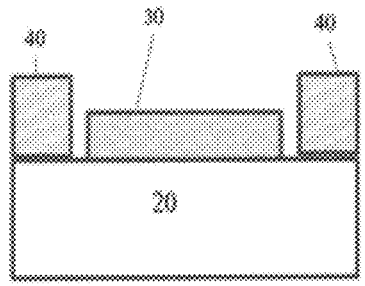
Figure 1C:
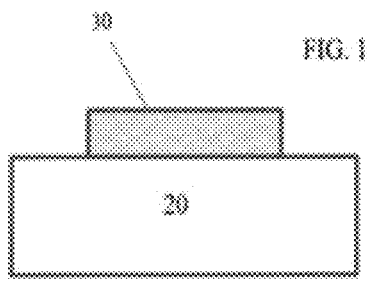
Figure 1E:
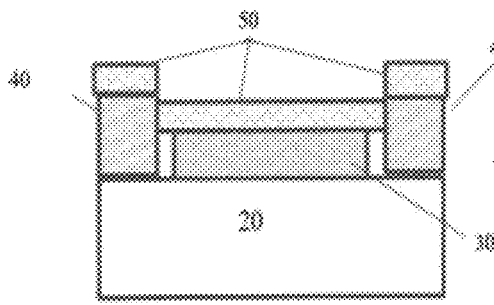
Figure 1F:
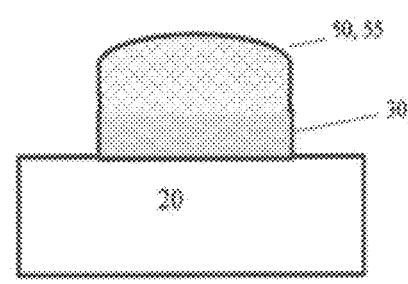
Figure 2A:
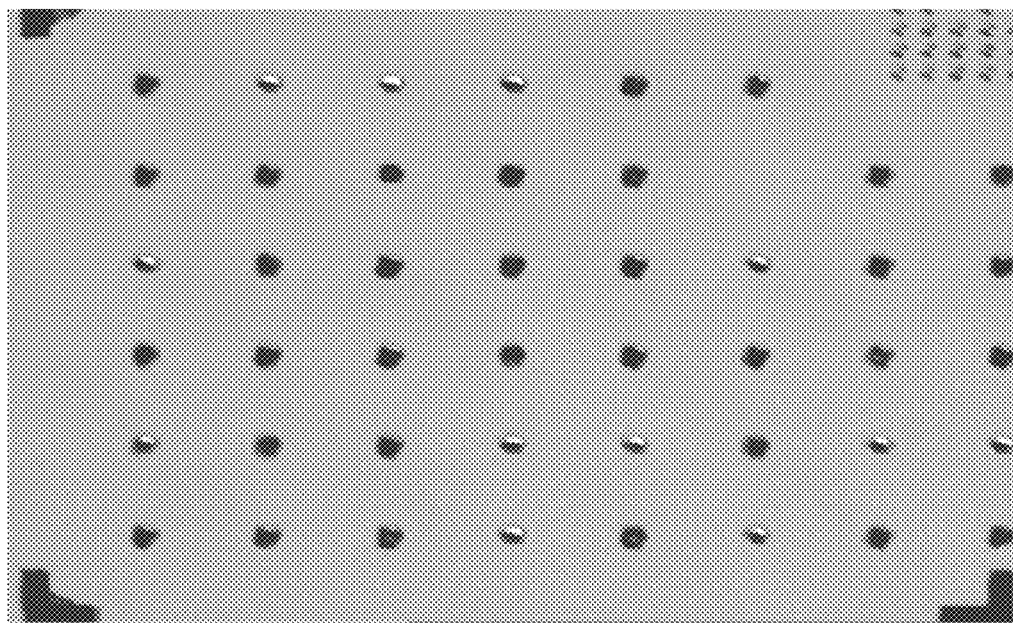
FIGS. 2A-2C depict representative solder balls observed by scanning electron microscope (SEM) at increasing resolution, in accordance with one or more embodiments of the present invention.
Figure 2B:
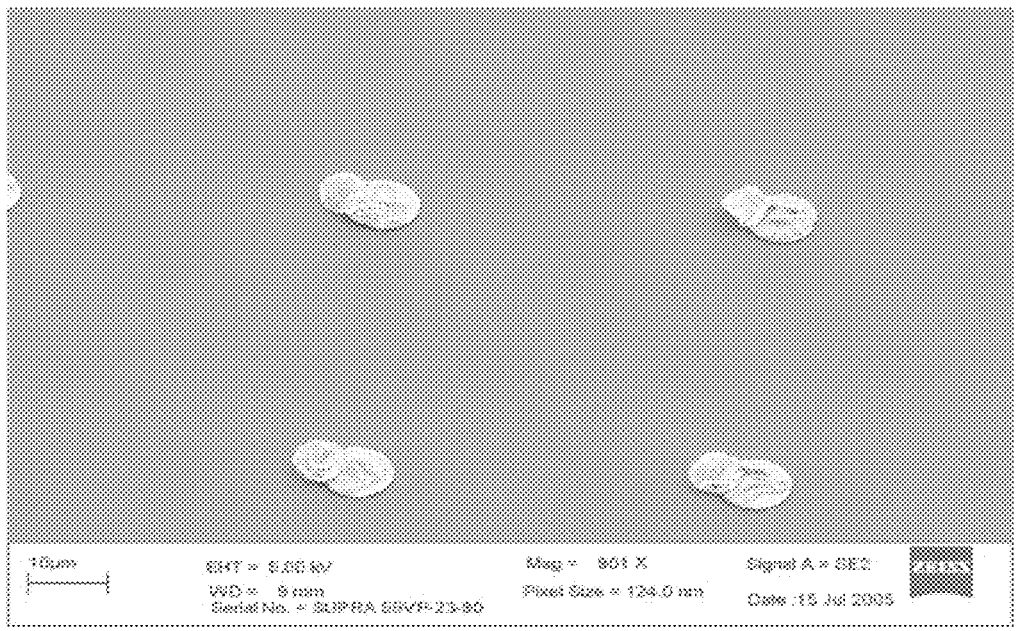
Figure 2C:
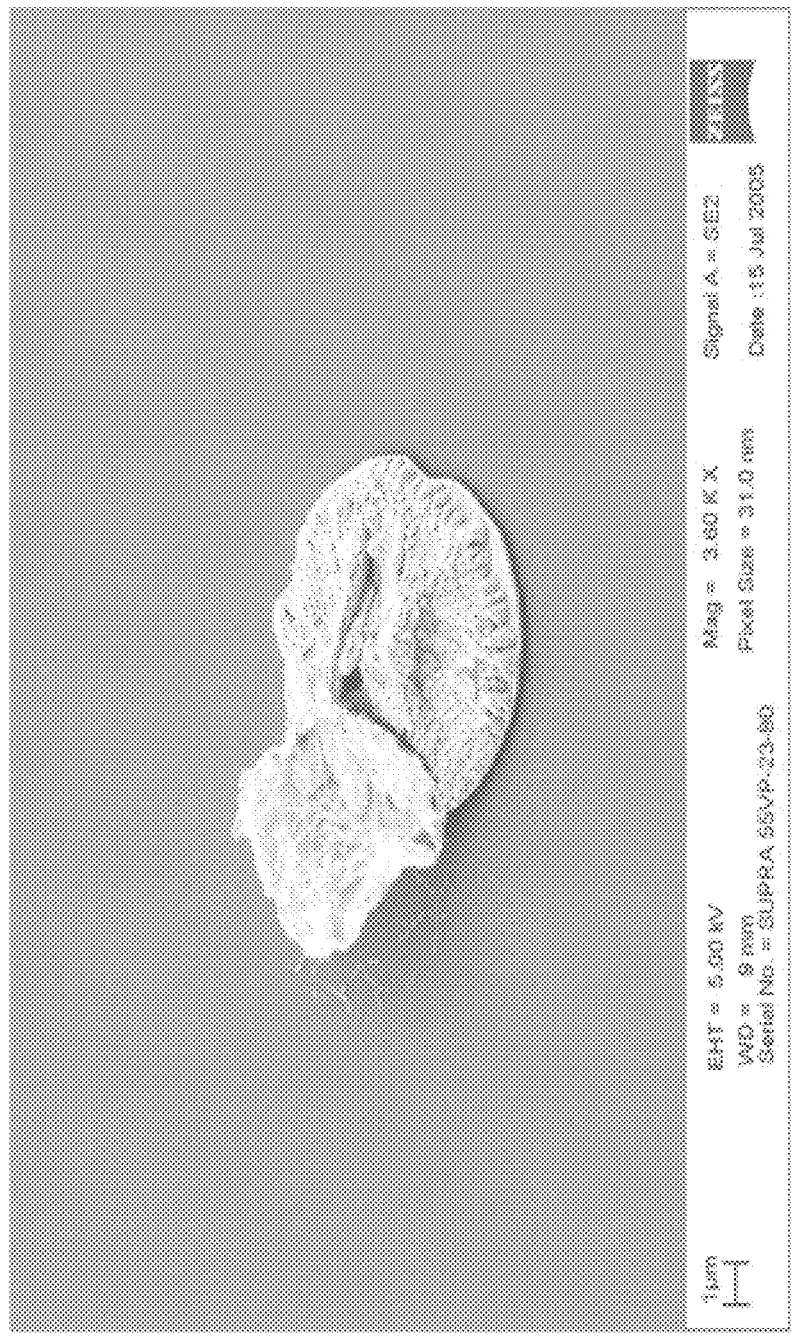
Figure 3:
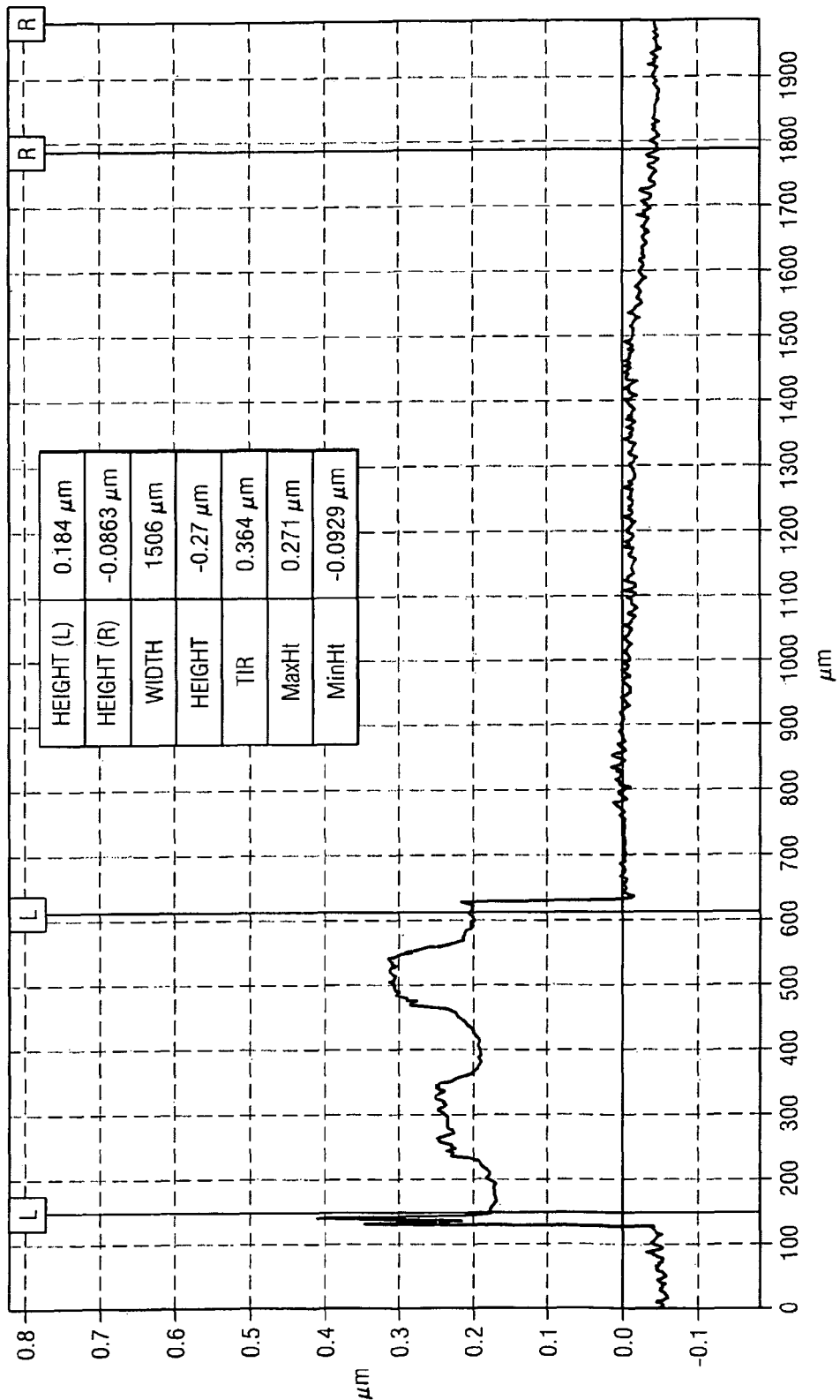
FIG. 3 depicts a profilometer analysis after a solder process described herein, in accordance with one or more embodiments of the present invention.

In one example, a 50:1 hydrofluoric acid dip for 3 minutes was used to clean a wafer substrate 20. Hexamethyldisilazane (HMDS), which may be used as an adhesion promoter for photoresist, was spin coated at about 3000 rpm for 40 seconds. A positive first photoresist 10 was spin coated at 2000 rpm for 30 seconds to provide a thickness of 2 μm. The wafer substrate 20 was soft baked at 90 degrees C. for 60 seconds, exposed for 12.5 seconds and then developed in an appropriate developer for 35 seconds. The wafer substrate 20 was then hard baked at 90 degrees C. for 90 seconds. Ti (100 nm) then Pt (100 nm) then Au (100 nm) were deposited as base metals 30 sequentially through E-beam evaporation. The first photoresist 10 was lifted off in acetone. The second photoresist 40 (which in this case was the same material as the first photoresist 10) was then aligned and patterned for a solder metal layer 50. This was followed by deposition of solder metal 50 comprising alternate layers of Sn (0.6 μm) and Au (0.02 μm) by E-beam evaporator and then lift off of the second photoresist 40 with acetone. A mask used provided that the base metal 20 width that was less than that of the deposited solder metal 50. Solder metal 50 depositions were carried out using the E-Beam evaporator. The reflow occurred at 230 degrees C. A ball shape 55 (which might also be characterized as a "hump") of the solder metal 50 was observed during reflow. The term "bump" is used herein to refer to the shape of the solder layer before reflow, while a ball shape or a hump may form after re-flow of the solder. Solder height after reflow for this example is depicted in FIG. 3 as measured by a profilometer. (FIGS. 2A-2C depict solder after reflow for other examples. In these examples, the reflowed solder has an irregular shape, perhaps as a result of imprecise alignment of the solder layer with the base metal layer. But the height of the reflowed solder in FIG. 2A-2C is acceptable.).

In another example, the base metal layer 30 was formed with Cr (0.01 . μm) and Au (0.2 .μm). Process flow is as described with the previous example. Deposition was carried out using thermal evaporation. When the solder metal 50 was applied, the width of the base metal layer 30 was either greater than or the same as the diameter of the solder metal 50. When the width of the base metal layer 30 was greater, it was 200 μm and the diameter of the solder balls 55 were between from 30 and 130 μm. Here, reflow was performed on a hotplate (heated to an initial temperature of 180 degrees C. and gradually ramped up to 250 degrees C.). Reflow occurred at 230 degrees C. The solder metal 50 did not form a hump for this example. If the reflow is conducted in air (rather than inert gas) and the solder metal oxidizes, the result could be that no hump will form.

When the width of the base metal 30 and the solder metal 50 were the same, there was an increased height of the solder metal 50 after reflow, while the diameter of the solder balls 55 remained the same. Here, the solder metal 50 was heated to 225 degrees C. for 5 minutes. Profilometer readings are depicted in TABLE 2.

TABLE 2

| Before Reflow | | After Reflow | |
|---|---|---|---|
| Width (μm) | Height (μm) | Width (μm) | Height (μm) |
| 129 | 1.93 | 129 | 2.6 |
| 83.5 | 1.93 | 83.5 | 2.74 |
| 53.7 | 2.0 | 53.7 | 2.8 |

Figure 4D:
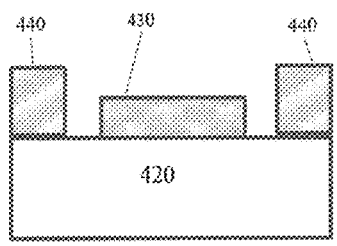
FIG. 4 depicts another representative solder process described herein, in accordance with one or more embodiments of the present invention.

In another embodiment, depicted in FIGS. 4A-4H, the width of a solder metal 460 was greater than that of a base metal 430. The process flow is provided in FIG. 4A-H, in which a first photoresist 410 is initially spin coated on a substrate 420, optionally patterned and developed (FIG. 4A) followed by deposition of the base metal 430 (FIG. 4B). This is followed by lift-off of the first photoresist 410 (FIG. 4C) and then addition of a second photoresist 440 by spin coating with optional patterning and developing (FIG. 4D). Second photoresist 440 may be different than first photoresist 410. In FIG. 4E, a third photoresist 450 is then added by spin coating, patterning and developing, followed by deposition of the solder metal 460 in alternate layers (FIG. 4F). In FIG. 4G, the third photoresist 450 is lifted off. In FIG. 4H, reflow of the solder metal 460 is performed providing an increased height of a re-flowed solder metal shown as 470.

An example of FIG. 4 is provided in which the base metal layer 430 was Cr (20 mm) and Au (200 nm). Here, HMDS was spin coated on cleaned wafer substrates 420 at 3000 rpm for 40 seconds. A positive first photoresist 410 was spin coated at 2000 rpm for 30 seconds to form a thickness of 2 um and was then soft baked 90 degrees C. for 60 seconds, exposed for 12.5 sec, developed for 35 seconds and hard baked 90 degrees C. for 90 seconds. Cr (20 nm) then Au (200 nm) were each deposited, as the base metal 430, by thermal evaporation. The first photoresist 410 was lifted off with acetone. A negative second photoresist 440 was then added by spin coating at 2000 rpm for 30 seconds, softbaked at 65 degrees C. for 2 minutes, softbaked again at 95 degrees C. for 5 minutes, exposed for 17 seconds, baked at 65 degrees C. for 1 minutes and 95 degrees C. for 2 minutes, and then developed for 1 minutes, followed by rinsing and blowing dry. The wafer substrate 420 was then hard baked at 175 degrees C. for 30 minutes and spin coated in HMDS at 3000 rpm for 40 seconds. A positive third photoresist 450 was added at 4000 rpm for 30 seconds to form a thickness of 1.4 µm, soft baked at 90 degrees C. for 60 seconds, exposed for 12.5 seconds, developed for 35 seconds and hard baked at 90 degrees C. for 90 seconds. The solder metal 460 was deposited as Sn (0.6 µm) then Au (0.02 µm) then Sn (0.6 µm) then Au (0.02 µm) by thermal evaporation. The positive third photoresist 450 was then lifted off in acetone. A profilometer was used to determine solder height after reflow, which is depicted in TABLE 3. When the width of the solder metal 450 before reflow was greater than that of the base metal pad 430 due to the step structure of the solder metal 450, a decrease in width of the solder metal 450 was observed after reflow; a hump shape was not observed. The profilometer readings were taken at different diameters of the base metal pads before and after reflow. At least two samples were tested for reflow results and profilometer reading were done on at least two samples. As seen in Table 3 below, the height of solder after reflow in air can be increased by making the solder width greater than the base metal pad width.

TABLE 3

| Base Pad | Before Reflow | | After Reflow | |
| --- | --- | --- | --- | --- |
| Diameter (µm) | Width (µm) | Height (µm) | Width (µm) | Height (µm) |
| 80 | 84.5 | 2.5 | 84.5 | 3.89 |
| 70 | 152 | 2.5 | 71.6 | 5.01 |
| 60 | 104 | 2.5 | 88.4 | 4.3 |
| 50 | 82.5 | 2.5 | 46.7 | 4.4 |
| 40 | 75.5 | 2.5 | 89.4 | 4.3 |

In combination with solder metal reflow as described, adhesion of substrates for vertical stacking is performed by bonding of two or more substrates using a dielectric polymer as a glue. A suitable polymer is one with good mechanical strength, low out gassing, low sensitivity to surface preparation, low dielectric constant, thermal stability, solvent resistance, low cure temperature and little to no reflow during bonding. In addition, the polymer is preferably optically transparent. In various preferred embodiments, the glue is a thermoset polymer that relies on cross-linking for curing. In addition, the preferred polymer may be patterned using standard lithography (or a suitable alternative). This may avoid providing an additional layer of photoresist; however, when desired, the additional layer of photoresist may be provided. A representative glue is BCB, including one that is photopolymerizable. Examples are those of the 3000 and 4000 series from The Dow Chemical Company, Illinois, USA.

In general a bonding process herein includes providing the glue, typically by spin coating, soft baking, exposing, and pre-developing. While pre-developing is not essential, without a pre-develop bake, a development end point increases as the film sits at room temperature and is dependent on the time delay between process steps. A pre-develop bake resets the development end point, thus, development is not dependent on the time delay between a soft bake and development.

An example is provided as illustrative of a bonding process herein in which prepared wafer substrates (cleaned or otherwise) are spun at 3000 rpm for 30 seconds following by a static dispersion of the polymer glue to the wafer, which is then spun at 4000 rpm with a ramp rate of 1000 rpm/sec for 30 sec to achieve a thickness of about 4.1 µm. A higher ramp rate is used to avoid striations during spin coating. The wafer is then soft baked at 65 degrees C. for 90 seconds, expose for 24 seconds and pre-developed by baking at 60 degrees C. for 5 minutes. This is following by developing at 40 degrees C. for 1 minutes; if developed at less than 40 degrees C. or at room temperature, development will take longer (up to about 1 hour at room temperature). The wafer is then rinsed in developer at room temperature for 30 seconds. Development is stopped by suitable methods, such as post-baking at elevated temperature (about 100 degrees C. for 1 minutes and optionally rinsing in water). From a 4.1 µm thickness, the layer was reduced to 3 µm after curing.

Variations in glue cure rate and degree of cure may be obtained by altering the cure time and/or cure temperature. For example, hard cures (about 95% or more) and partial cures (at about 70%) were obtained for BCB by using representative selection steps in TABLE 4.

TABLE 4

| | Hard Cure | Partial Cure |
| --- | --- | --- |
| Ramp | 150 degrees, 15 min | 150 degrees, 15 min |
| Soak | 150 degrees, 15 min | 150 degrees, 15 min |
| Ramp | 250 degrees, 1 hour | 210 degrees, 1 hour |
| Soak | 250 degrees, 1 hour | 210 degrees, 1 hour |
| Cool | 50 degrees | 50 degrees |

Figure 5:
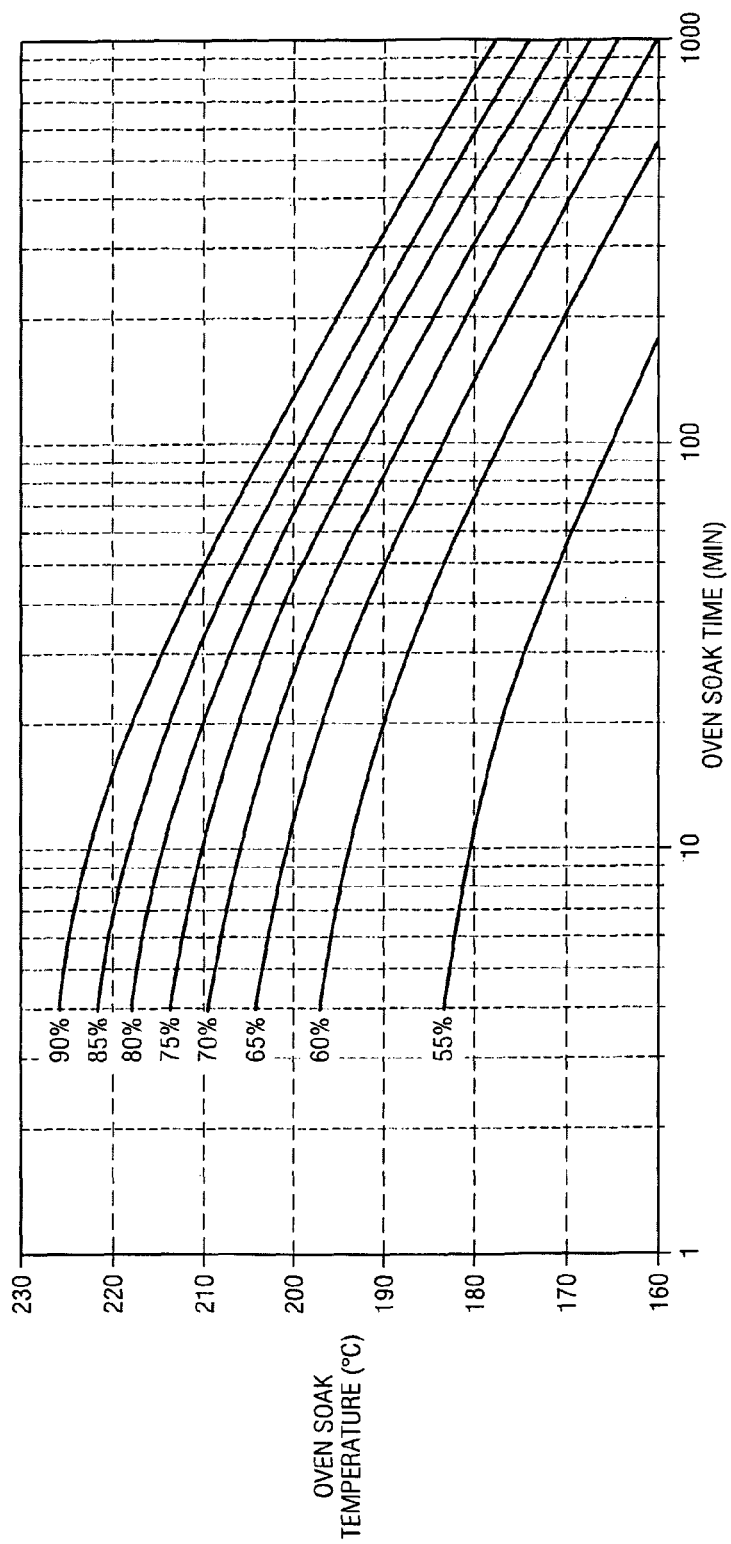
FIG. 5 depicts representative curing curves for a photosensitive polymer suitable for bonding, in accordance with one or more embodiments of the present invention.
Figure 8A:
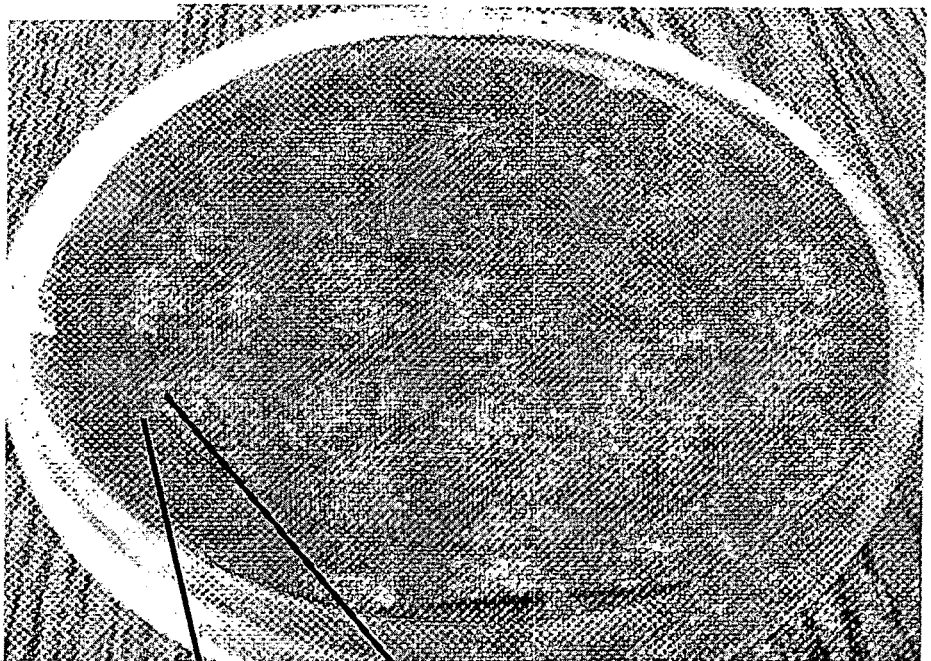
FIG. 8A depicts representative wafer bonding at 2000 N and 3000 N pressure, in accordance with one or more embodiments of the present invention.
Figure 8B:
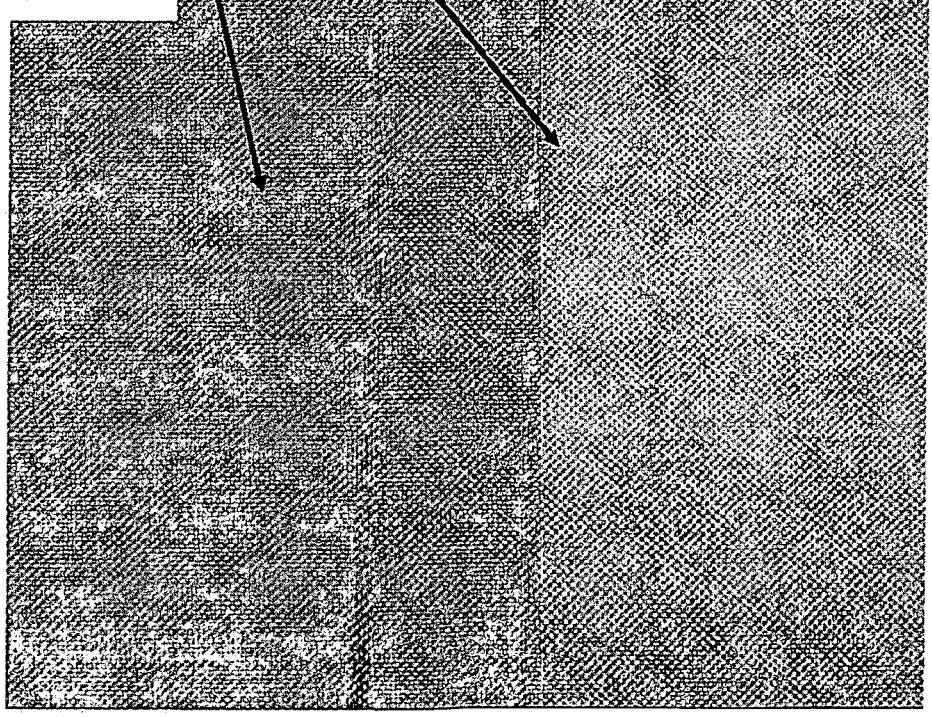
FIG. 8B depicts a representative microscope image showing no reflow in FIG. 8A, in accordance with one or more embodiments of the present invention.
Figure 9A:
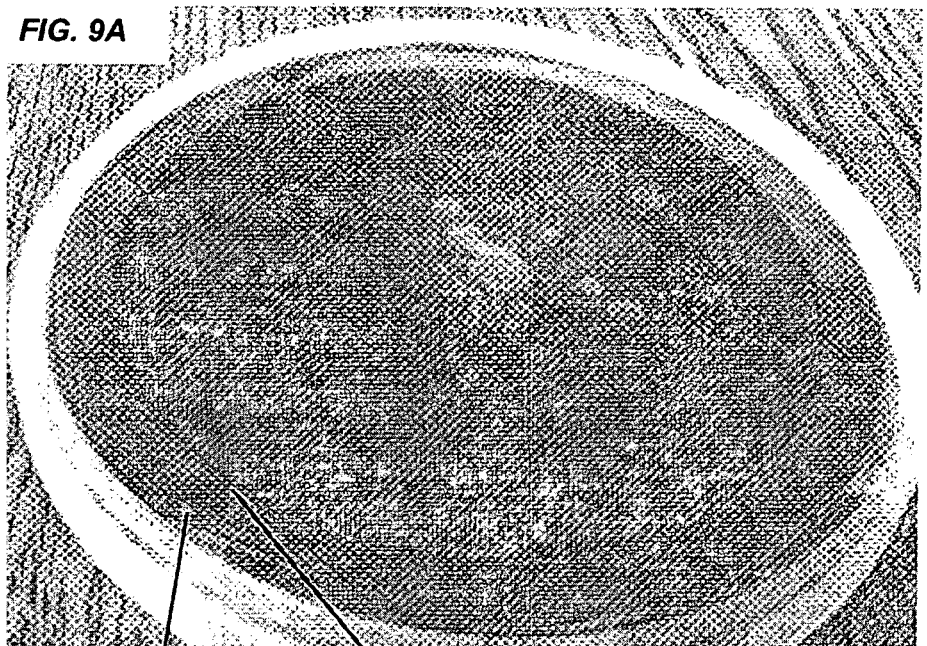
FIG. 9A depicts representative wafer bonding at 3000 N and 3340 N pressure, in accordance with one or more embodiments of the present invention.
Figure 9B:
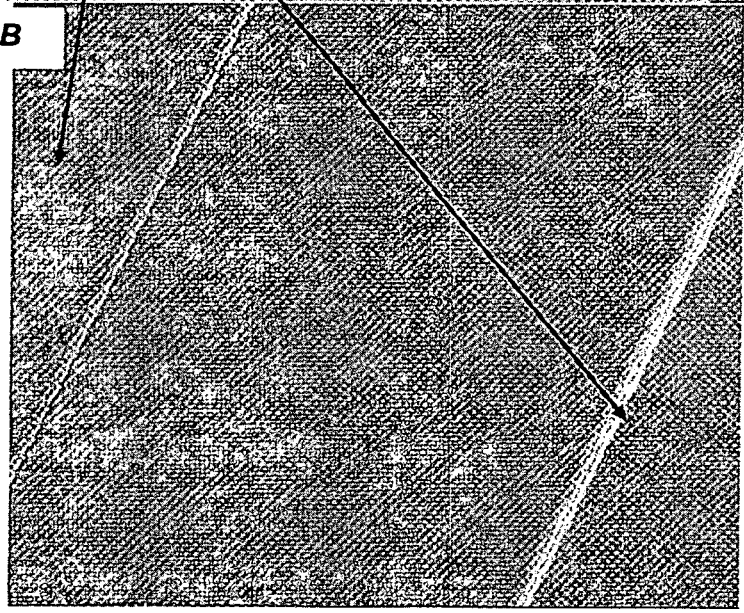
FIG. 9B depicts a representative microscope image showing no reflow in FIG. 9A, in accordance with one or more embodiments of the present invention.

FIG. 5 shows curing curves for a BCB as a function of time and temperature. Similar curves may be provided by other glues, which allow one to preselect a desired rate and/or degree of cure. Typically any desired patterning of the glue should be possible as shown in FIGS. 6A and 6B. FIGS. 7-9 show representative examples of bonded wafer substrates in which a 4 inch silicon wafer is bonded to a 4 inch silica glass (Pyrex®, Corning Incorporated) wafer using preparations steps described in TABLE 5. Voids were absent when processing was performed in a class 100 (or lower) cleanroom and when pressure was sufficiently high. For example, with several 4000 series BCBs from The Dow Chemical Company, 55% curing and 3000 N or greater bonding force was suitable to prevent trapping of solvents between 4 inch wafer substrates and prevent voids (FIG. 9). Figures depicted as (A) in FIGS. 7-9 show the entire image; figures in (B) show a close-up of the BCB with no reflow of BCB.

TABLE 5

| | |
|---|---|
| FIGS. 7A-7B | Hard cured BCB without patterns. Bonding tested at 250 degrees C, $1e^{-3}$ mbar vacuum and 500 Newtons pressure for 5 minutes then 1000 Newtons pressure for 5 minutes |
| FIGS. 8A-8B | Hard cured BCB without patterns. Bonding tested at 250 degrees C, $1e^{-3}$ mbar vacuum and 2000 Newtons pressure for 5 minutes then 3000 Newtons pressure for 5 minutes |
| FIGS. 9A-9B | Partially cured BCB without patterns. Wafer bonding tested at 250 degrees C, 3000 Newtons pressure for 5 minutes and $1e^{-3}$ mbar vacuum then 3340 Newtons pressure for 15 minutes and $2e^{-4}$ mbar vacuum |

Wafer bonding is a critical step in micropackaging and guarantees active devices are formed therefrom that are protected from the operating environment. Vertical integration by a 3D wafer-level packaging technique described herein includes stacking of suitable semiconductor substrates (e.g., silicon, silicon-on-insulator, glass, ceramic wafers) manufactured using different micromachining technologies. Wafer stacks herein may further incorporate IC electronics, MEMS, microfluidics and microoptics as needed without affecting process flow as described herein. Bonding relies on a patternable polymer as previously described.

As such, coordinated and/or simultaneous wafer level bonding and interconnect formation is performed herein without a need for conventional drilling and filling (required with other vertical stacking processes). Process parameters described herein are readily combined with known fabrication steps and provide one of ordinary skill with know how to selecting interconnect diameters for typical MEMS, electronic or other similar applications. Advantageously, small interconnect diameters (few microns to less than 10 microns) are achieved with the descriptions provided herein.

In contrast with other vertical stacking methods in which bonding is performed via flip-chip, described herein are fully cured and partially cured polymer-bonded substrates that do not reflow into micromachined cavities during the bonding step (see FIGS. 7-9). In addition and advantageously, vertical electrical interconnects are formed between bonded wafer substrates, such that mechanically strong and bonded wafers are coupled with electrical interconnects via soldering. A thin layer of a polymerizable glue as the wafer bonding interface and spacer material and a soldered metal of a suitable height (e.g., at or about 10 µm or less) are used.

A structure described herein includes at least two wafers bonded by a polymerizable polymer. The wafers are stacked vertically and bonding occurs in coordination with or simultaneous with solder reflow. The structure is thus of low power consumption (little or no parasitic capacitance) with small delay (short interconnection lengths) of suitable size and weight with little noise a small footprint. FIG. 10 illustrates such a structure comprising at least a first wafer 1002, a second wafer 1004, a bonding layer 1006, a vertical interconnect 1008 (which has been created through solder reflow of solder layers deposited on each wafer as previously described herein) in contact with a first base metal pad 1010 on the first wafer and a second base metal pad 1012, on the second wafer.

Such structures do not require an underfill material or drilling holes and additional metallization for interconnect formation, as is required with other vertically-stacked structures.

In an example, a polymer of BCB was chosen as the glue to bond two silicon-containing substrates, one a silicon wafer and the other a glass wafer. BCB was selected for its photosensitivity and for patterning using standard lithographic techniques. A suitable film range was 2.7 to 6.9 µm thick. The selected thickness here was about 3 µm layer on each wafer (provided similar to that described previously). Vertical electrical interconnections between bonded wafers were formed through solder bump reflow. The solder reflow temperature was bound by the curing temperature (180 to 250 degrees C.) and glass transition temperature (greater than 350 degrees C.) of the BCB. Two solder compositions were used: 95% Sn with 5% Au having a near eutectic melting temperature of 217 degrees C. and 80% Au with 20% Sn having a eutectic melting temperature of 280 degrees C. The reflow temperature for 95% Sn/5% Au and 80% Au/20% Sn are 250 degrees C. and 320 degrees C., respectively. For 95% Sn/5% Au, the compositions were selected so as to have the solder reflow performed simultaneously with BCB curing. For the 80% Au/20% Sn composition, the solder reflow was coordinated and performed after bonding. The solder metal was deposited either in alloy form or as alternating layers of Au and Sn to reach the desired composition. The Au—Sn alloy exhibited inter-diffusion to form an Au—Sn compound, even at room temperature (evidenced by a grayish color of the solder after deposition, even though the top layer was gold). When sequential multiple layers were deposited, they homogenized after reflow.

Figure 11A:
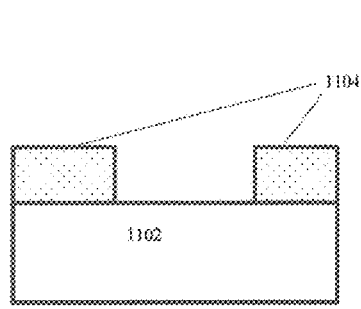
FIGS. 11A-11H depict another representative process flow for soldering as described herein, in accordance with one or more embodiments of the present invention.
Figure 11B:
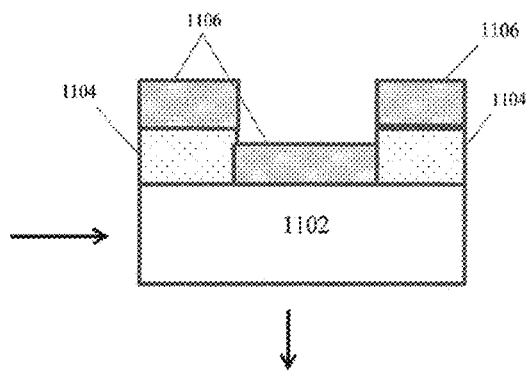
Figure 11D:
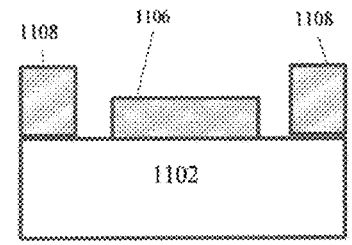
Figure 11C:
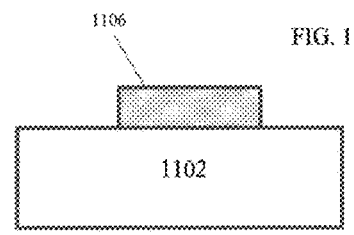
Figure 11E:
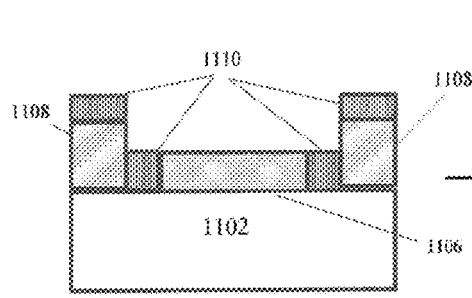
Figure 11F:
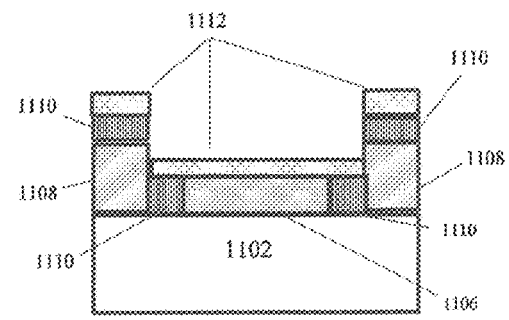
Figure 11H:
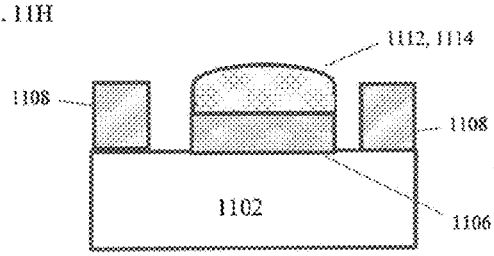
Figure 11G:
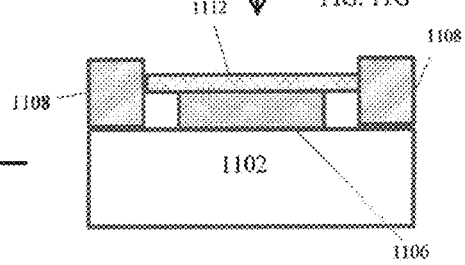

A fabrication process (incorporating features of FIGS. 1 and 4) is depicted as FIGS. 11A-11H. In brief, a silicon wafer 1102 was cleaned and patterned using a 1 µm thick layer of a positive first photoresist 1104 for base metal deposition (FIG. 11A). The addition of the base metal 1106 was via sequential deposition of three layers of titanium, platinum and gold, each 0.1 µm thick (deposited via an E-beam evaporator) (FIG. 11B). After evaporation, lift-off was performed (FIG. 11C). An adhesion promoter and a photopolymerizable BCB 1108 were then spin-coated to 3 µm thickness. The BCB was exposed, patterned and developed to define the area for wafer bonding (FIG. 11D). Partial curing or hard curing of the BCB 1108 was done in an inert gas environment according to its curing profile (a function of time and temperature). The wafer 1102 was further patterned with a 1 µm thick layer of a second photoresist 1110 (FIG. 11E) for solder metal deposition. The solder metal pattern was then aligned on top of the already deposited base metal pad 1106, followed by addition of a multilayer solder metal 1112 via deposition of Sn—Au (FIG. 11F). For solder metal 1112 and bumps formed therefrom comprising 95% Sn and 5% Au, a sequential deposition of Sn (600 nm) and Au (20 nm) were performed several times until a desired solder thickness was achieved (FIG. 11G). A second liftoff in acetone for 5-10 minutes left behind a multilayer solder 1114 only in pre-selected/required regions (FIG. 11H). FIG. 12 depicts alignment of two wafers 1202, 1204, their bonding layers 1205, 1206, base meal layers 1210, 1211 and solder layers 1212, 1214. FIG. 10, as previously discussed, depicts a representative structure described herein that was formed by coordinated and/or simultaneous bonding and electrical interconnect formation.

Different curing percentages of the BCB (from 35% to 95%) were used. Curing was performed in a nitrogen environment using a standard mechanical convection oven. Wafers, each with a cured BCB layer, were aligned and bonded using a bonder and aligner at 3340 N pressure. Reflow temperature for an 80% Au-20% Sn solder was about 320 degrees C. and that for 95% Sn-5% Au was about 230.degree. C. The dwell time in both solder reflow was between 5 to 10 minutes. No reflow was observed in patterned channels for wafers bonded with 55% or more cured BCB layer. Void-free and solvent-free bondings were obtained. Some residual solvent was trapped between wafers bonded with BCB cured at less than 55%. Curing at closer to 100% required a higher force for bonding. A razor blade inserted between the silicon and glass wafer provided a check of bond strength; silicon or glass wafers cracked and broke or BCB as a film residue remained on one wafer only. Thus, the bond strength of the BCB to BCB interface was higher than that of the BCB to substrate interface. Accordingly, viscosity of a suitable polymerizable polymer for bonding should have sufficient viscosity for adequate bonding (e.g., void-free and solvent-free). Sufficient viscosity is identified as a viscosity similar to that achieved with a BCB series 4024 resin from The Dow Chemical Company when cured at 55% or greater.

Figure 13E:
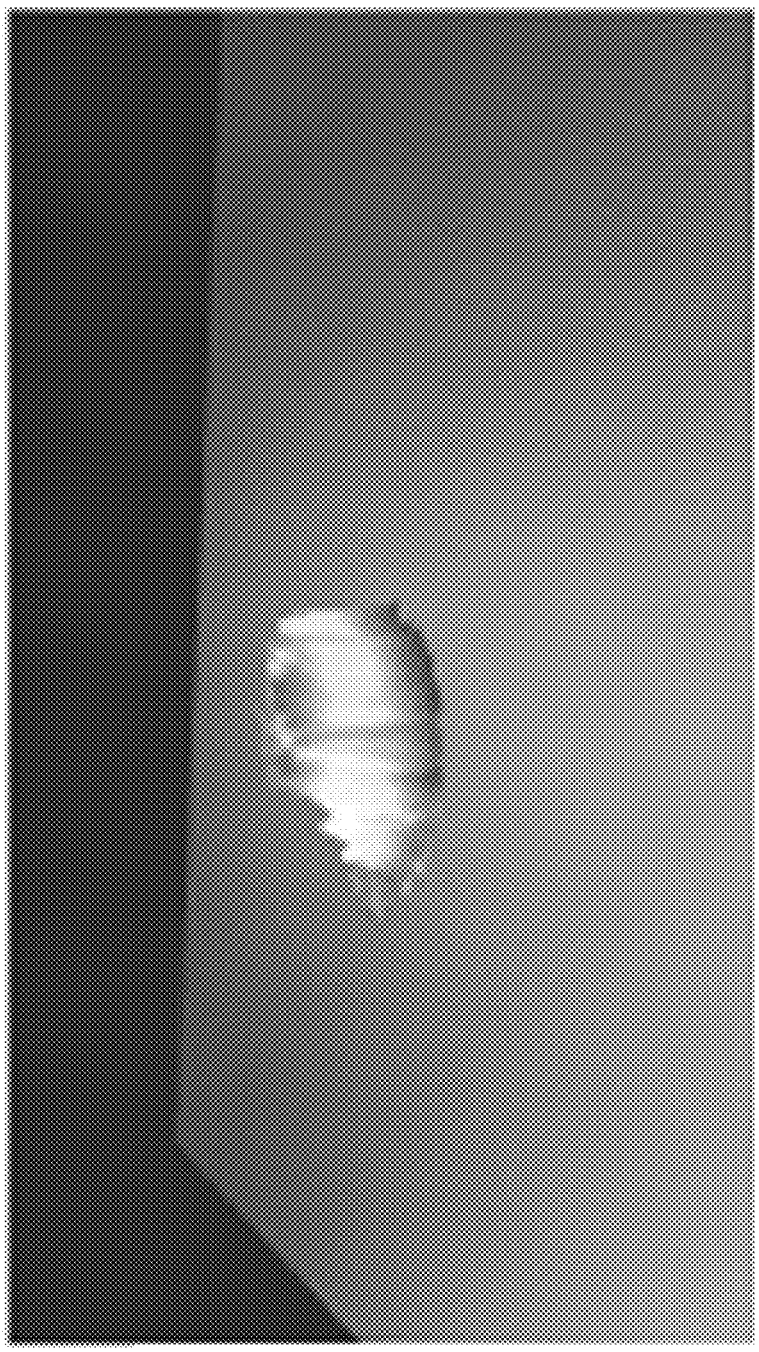
FIG. 13E is a representative 3D-profiler and model depicting solder height after reflow as described herein, in accordance with one or more embodiments of the present invention.

A solder reflow profile for Au—Sn alloy was a bell shaped profile with equal heating and cooling rates. The reflow temperature was around 30 to 40 degrees C. higher than the melting temperature of the alloy; the total time above the melting temperature was preferably not more that 4-5 minutes. Four inch wafers diced into quarter-inch pieces were used for reflow demonstrations of both compositions (depicted in TABLE 6). Each quarter of the wafer had an array 1300 of 40 by 40 solder bumps (FIGS. 13A and 13B). FIG. 13A depicts an interconnect 1340 between a first and a second wafer 1310, 1320, each wafer having a base metal layer 1330a, 1330b, the interconnect 1340 having been formed from the alignment and reflow of a solder metal layers on the first and second wafers 1310, 1320. Ten such samples were reflowed in a nitrogen environment to avoid oxidation of the solder metal. The height of the solder metal and the base metal before reflow was recorded to be 2.5 µm. However, the height of the solder bump after reflow was more than 4 µm. Thus, even though the height of a solder prior to reflow was less than the height of BCB, the maximum height of solder after reflow was more than 3 µm and more than 4 µm and more than 5 µm, indicating solder reflow may form electrical interconnections as described herein. Optical microscope images of solder bumps on a base metal platform are shown in FIG. 13C (before reflow) and FIG. 13D (after reflow). FIG. 13E shows a representative 3D-profiler depicting the solder height after reflow; in the figure, the height is 5.82 µm.

TABLE 6

| Base Pad Diameter (µm) | Solder Diameter Before Reflow (µm) | Before Reflow Height (µm) | After Reflow Maximum Height (µm) |
|---|---|---|---|
| 80 | 120 | 2.5 | 3.89 |
| 70 | 105 | 2.5 | 5.01 |
| 60 | 90 | 2.5 | 4.3 |
| 50 | 75 | 2.5 | 4.4 |
| 40 | 60 | 2.5 | 4.3 |

Figure 14:
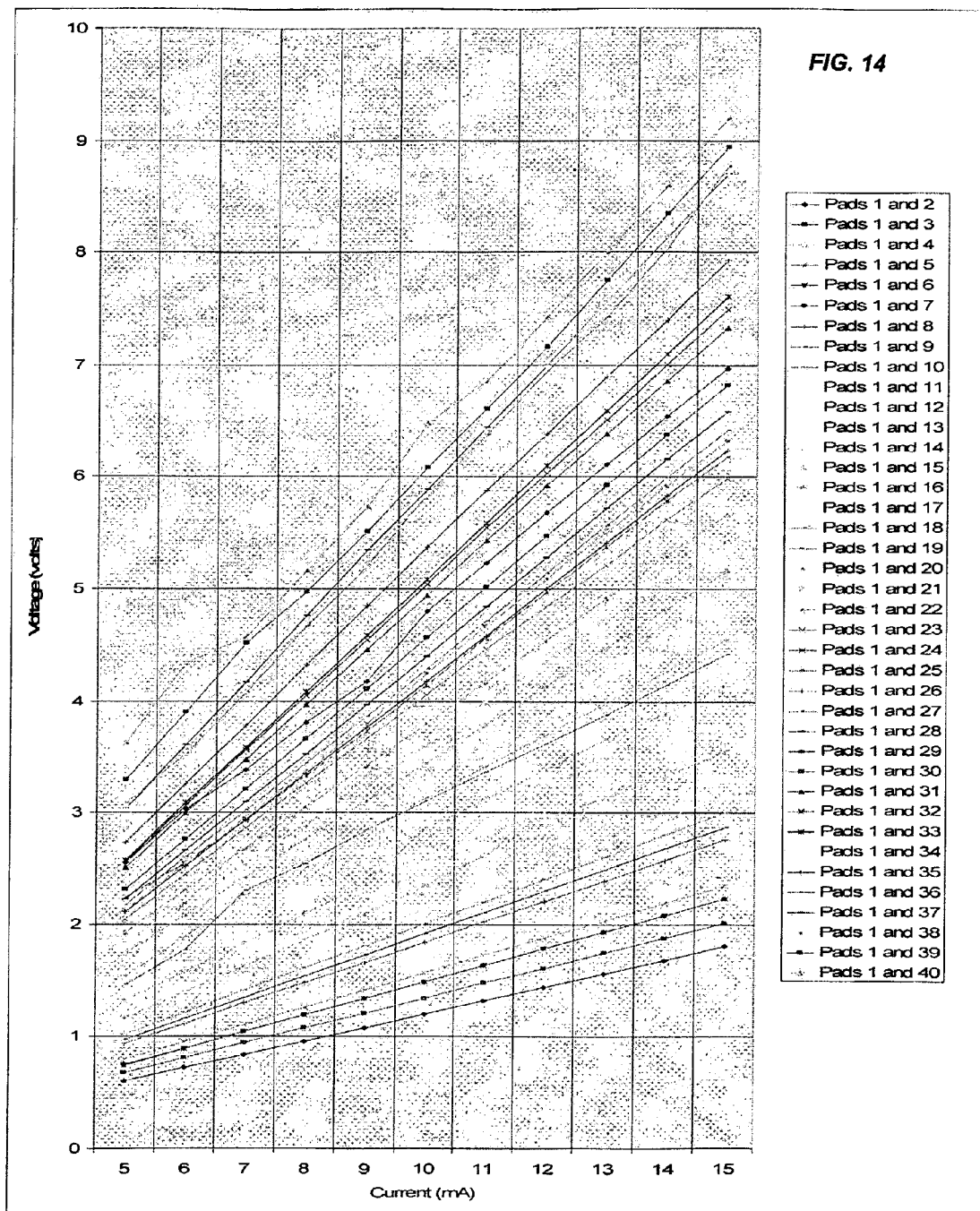
FIG. 14 depicts current-voltage data between contact pads of bonded wafer pairs as described herein, in accordance with one or more embodiments of the present invention.

A total of 6400 solder metal depositions each on silicon and glass wafers were reflowed to form electrical interconnect between wafers. Further resistance measurements were carried out on similar samples. The average resistance measured between consecutive pads located on the same wafer was 121.8 ohms, with a standard deviation of 0.3 ohms. A constant current from 5 mA to 15 mA insteps of 1 mA was driven through the resistance network and the resulting voltage drop across the contact pad was measured. FIG. 14 shows plots of the voltage across the contact-pads versus the current showing that resistance (indicated by slope of the curve) gradually increases from pads 1:2 to pads 1:40. Resistance calculation through V-I measurements were tabulated in FIG. 15. Measurements were made on two different sets of bonded wafers and results were repeatable and show that interconnects formed after wafer bonding and reflow.

Modeling of 3D interconnects was performed to select the correct dimensions for interconnects in terms of diameter and pitch. These parameters determine interconnect densities and affect electrical properties (e.g., frequency-dependent inductance, resistance, capacitance). Small length of interconnects is desired for faster propagation and low losses at higher frequencies (>30 GHz), as parasitics increase RC delays and reduce the speed of the operation. Interconnect dimensions based on analytical and numerical modeling are very useful prior to fabrication.

Both a low frequency analysis that included a high current, low density and low frequency (S1), and a high frequency analysis that included a low current, high density and high frequency (S2) were performed. Low frequency analysis helps determine the maximum current carrying capacity of interconnects in a typical electro-thermal MEMS packaging application. High frequency analysis helps to understand skin effect at higher frequencies, resulting in an increase in the effective dissipation through interconnects in electrostatic or RF-MEMS (radio frequency MEMS) packaging applications.

S1 simulations used engineering design analysis software to numerically predict the steady-state temperature distribution across interconnect due to joule heating. As the interconnect diameter changed, the resistance of the interconnect increased as the square of that diameter. The purpose of the S1 simulations was to determine minimum values for the interconnect diameter at which the temperature across it is equal to or higher than the re-melting temperature of the solder. The 3D model comprises an interconnect, and includes base metal and solder metal deposition, and a silicon and glass substrate, as shown in FIG. 16.

Symmetrical boundary conditions were applied as a single block across the interconnect. Simulation results were evaluated for two solder compositions used to fabricate the interconnects: (a) 95% Sn/5% Au and (b) 80% Au/20% Sn. Electrical resistivity for these two solder compositions were estimated from known values of pure metal compositions. A constant current of 10 mA was applied across the interconnects to assess their maximum current carrying capability at different interconnect diameters. This is a value typical for the operation of electro-thermal MEMS devices. From the simulation results, it was observed that interconnect diameter smaller than 10 µm for 95% Sn/5% Au and 5 µm for 80% Au/20% Sn caused slight increases in interconnect temperature, though not enough to melt the interconnect. The steady state temperature values obtained are provided in TABLE 7. Because values obtained from the simulations depend on the modeling assumptions and the material properties, they are provided as qualitative design guidelines.

TABLE 7

| Interconnect Diameter (µm) | Temperature 95 Sn/5 Au (° C.) | Temperature 80 Au/20 Sn (° C.) |
|---|---|---|
| 1 | 1263 | 76.2 |
| 2 | 149.1 | 25.7 |
| 3 | 49.1 | 22.02 |
| 4 | 30.7 | 21.3 |

TABLE 7-continued

| Interconnect Diameter (μm) | Temperature 95 Sn/5 Au (° C.) | Temperature 80 Au/20 Sn (° C.) |
|---|---|---|
| 5 | 25.1 | 21.3 |
| 10 | 21.3 | 21.0 |
| 20 | 21.0 | 21.0 |

High current (low density and low frequency) modeling as described herein (S1) provides a lower limit of about 5 micron for an interconnect diameter that is achievable with a solder composition of 95% Sn/5% Au. A lower limit of about 2 micron for an interconnect diameter is achievable with a solder composition of 80% Au/20% Sn. As such, represented herein is a method of modeling and determining interconnect size for high current (low frequency) devices in which a temperature value is obtained when material properties and dimensions of the interconnect are known. The temperature value obtained will provide both design and feasibility information in advance of fabrication.

For S2 simulations, skin effect was taken into account as it plays a significant role at high operating frequencies. This effect is the tendency of alternating current at higher frequencies to distribute itself within a conductor such that the current density at the surface of the conductor is greater than that at its core. This limits the cross-sectional area of the conductor available for carrying the current, thus increasing the resistance of the conductor to the flow of current through it. The effective resistance is higher than that at DC or low AC frequencies. A simple formula for the depth of penetration of current in the conductor (skin depth) in vacuum is given as:

$$\delta = \frac{1}{\sqrt{\pi f \mu \sigma}},$$

where $\delta$ is the skin depth, f is the frequency of operation, $\mu$ is the permeability of vacuum $1.26 \times 10^{-12}$ H/μm, $\sigma$ is the electrical conductivity of the material. The value for skin depth was calculated at frequencies varying from 100 MHz to 50 GHz. The electrical conductivity of 80% Au/20% Sn was approximated to that of pure Au and the electrical conductivity of 95% Sn/5% Au was approximated to that of pure tin. FIG. 17 shows the plot of skin depth vs. frequency for both solder compositions. At higher frequencies the depth of penetration decreases i.e. the current is more concentrated at the outer surface of the interconnect.

The available area of the interconnect for current flow decreases, which in turn increases the effective resistance of interconnect. The area of interconnect is calculated as: $A = \pi r^2 - (r-\delta^2) = \pi(2r \cdot \delta - \delta^2)$, where, r is the radius of the interconnect and $\delta$ is the skin depth. If the interconnect height is l, the effective resistance becomes:

$$R = \rho \frac{l}{\pi(2r\delta - \delta^2)}.$$

This implies that the resistance of interconnect for smaller diameters is high at high frequency of operation. Thus the power loss across interconnects due to heat dissipation (i.e. Joule heating) would be higher at high frequencies and lower interconnect diameters. FIGS. 18-19 plot the AC power dissipation for 100 mA currents at different operating frequencies and varying values of interconnect diameters.

At an operating frequency of 1 GHz, the penetration depth was 2.36 μm for 80% Au/20% Sn and 5.42 μm for 95% Sn/5% Au. As such, a good guideline for selecting a minimum interconnect diameter for 80% Au/20% Sn may be about 5 μm, and for 95% Sn/5% Au it may be about 15 μm. Calculated skin depth and power loss values for S2 analysis depend on the material property assumptions and are provided as qualitative design guidelines.

High frequency modeling as described herein (S2) provides a lower limit of about 15 microns for an interconnect diameter that is achievable with a solder composition of 95% Sn/5% Au. A lower limit of about 5 microns for an interconnect diameter is achievable with a solder composition of 80% Au/20% Sn. As such, disclosed herein is a method of modeling and determining interconnect size for high frequency devices in which a frequency value is obtained when material properties and dimensions of the interconnect are known. The frequency value obtained will provide both design and feasibility information in advance of fabrication.

The experimental data validate the process of simultaneous wafer bonding and interconnect formation. Modeling guidelines for selecting minimum interconnect diameters for interconnects, such as those fabricated from 80% Au/20% Sn and 95% Sn/5% Au in low-frequency/high frequency 3D packaging applications are also provided. While small interconnect diameters (<10 μm) help in achieving a high interconnect density, power losses due to heat dissipation and skin effects may be undesirable. It is also more difficult to achieve as precise wafer alignments with smaller interconnect diameters. Given that typical MEMS devices are powered via pads designed for wire-bonding with dimensions between 50 to 200 μm, a wafer-level stacking process as described herein may be a preferred alternative based on the many improvements described.

Stacked wafers with vertical electrical interconnects were formed from silicon and glass wafers bonded and a BCB layer of 3 μm thick as described before (and further disclosed in TABLE 8 for 80% Au/20% Sn interconnects). A metallization step to deposit Cr/Au was provided before base metal deposition to form metal lines for electrical testing. These metal lines ended in contact pads near the periphery of the silicon wafer. Simultaneous wafer bonding and interconnect formation was also carried out in a commercial wafer bonder using conditions summarized in TABLE 8 and depicted in FIG. 22A. A total of 6400 interconnects were reflowed.

TABLE 8

| Parameter | Value |
|---|---|
| Bonding Conditions: | |
| Bonding temperature | 200 to 250° C. |
| Vacuum | $2e^{-4}$ mbar |
| Bonding force | 3000 to 3500 Newtons |
| Bonding time | 30 to 45 minutes |
| Reflow conditions for interconnects: | |
| Solder reflow temperature | 310 to 340° C. |
| Solder reflow dwell time | ~5 minutes |

Resistance measurements were used to characterize such high density electrical interconnects. 40 by 40 interconnect grids were formed in each quadrant of 4 inch silicon and glass wafer pairs as depicted in FIG. 20, with interconnect diameter sizes varying between 10 μm and 80 μm in steps of 10 μm. In addition to solder bumps, a square pattern of Cr/Au interconnect lines was formed between 3D interconnects. Interconnect lines ran perpendicular to each other on the top and bottom wafers and were terminated on 40 metal pads on the bottom silicon wafers and 40 metal pads on the top glass wafers. These pads were later exposed by dicing and probed to estimate interconnect resistance (see FIGS. 22A and 22B; in 22B, arrow shows probe tips). In order to measure resistance of individual interconnects, it was necessary to probe from the bottom as well as from the top of the wafer stack, which is difficult because of probe positioning challenges. Initial resistance measurements between metal pads on the same wafer were made, which were used to indirectly estimate resistance of individual interconnects.

As a first order approximation, the resistance of metal lines or interconnects was estimated based on geometries and calculated directly using voltage and current experimental measurements as provided by:

$$R = \rho \frac{L}{A} = \frac{V}{I},$$

where $\rho$ is the approximate resistivity, L, the length of the metal, A, the cross sectional area, V, voltage across the resistor and I, current through the resistor. Horizontal interconnects consisted of a bi-layer Cr/Au metal lines between the vertical interconnects with total length L=32400 μm, width W=150 μm, and thickness T=0.2 μm. Because resistivity of Cr is much higher than Au, the metal line resistance was approximated to that of Au, and estimated a cross section $A=3\times10^{-11}$ μm$^2$ and resistance $R_1$=3.38 ohms. In order to estimate the resistance of the vertical interconnects between the bonded wafers, a schematic diagram (FIG. 20) and electrical equivalent circuit (FIG. 21) were used. Total resistance between any two consecutive contact pads included the resistances of metal line ($R_g$) and the base metal and solder resistance of the interconnect ($R_{BS}$). The metal lines between successive interconnects were 700 μm long, therefore their expected resistance was $R_g$=0.5154 ohm. The probe resistance $R_{PROBE}$ was 0.2 ohm.

To perform continuity and electrical testing, the top glass wafer was diced near the edges to expose the contact pads as shown in FIG. 22B. An optical probe station and a digital to analog converter interface was used for electrical testing. The continuity test performed using the digital multimeter interface of an input/output card interface showed that electrical paths were formed between silicon- and glass-bonded wafers due to solder reflow.

Two types of resistance measurements were performed on the bonded samples. Resistance was measured between consecutive pads located on the same wafer. Assuming that all the 3D interconnects are formed after reflow, the equivalent resistance of this circuit consists of approximately 40 of the cells in FIG. 21 stacked vertically. FIG. 23 shows the plot of voltage between the contact pads versus the current in the loop. Resistance was found to be almost the same as tabulated in TABLE 9. The average measured resistance was 121.8 ohms, with a standard deviation of 0.3 ohms.

TABLE 9

| Current 'I' (mA) | Voltage 'V' (volts) | Resistance 'R' (ohms) |
|---|---|---|
| 5 | 0.610506667 | 122.1013 |
| 6 | 0.73022 | 121.7033 |
| 7 | 0.850793333 | 121.5419 |
| 8 | 0.971766667 | 121.4708 |
| 9 | 1.093333333 | 121.4815 |
| 10 | 1.2157 | 121.57 |

TABLE 9-continued

| Current 'I' (mA) | Voltage 'V' (volts) | Resistance 'R' (ohms) |
|---|---|---|
| 11 | 1.338733333 | 121.703 |
| 12 | 1.462733333 | 121.8944 |
| 13 | 1.586966667 | 122.0744 |
| 14 | 1.711133333 | 122.2238 |
| 15 | 1.8359 | 122.3933 |

If the equivalent resistance of the circuit in FIG. 21 is approximated by the resistance of the first cell, and probing resistance is neglected, an upper bound approximation value for interconnect resistance is identified as: $R_e=2R_1+R_g+2R_{BS}+2R_{PROBE}$. And, $$R_{BS} = \frac{R_e - 2R_1 - R_g - 2R_{PROBE}}{2} = 56.804 \, ohms.$$

In another type of resistance measurements, one of the contact pads (pad 1) was fixed, and resistance from this pad to all other pads was measured. A constant current from 5 to 15 mA in steps of 1 mA was driven through the probes using a DC power supply. Retrieved V-I measurements were tabulated in FIG. 24. FIG. 25 shows voltage versus current plots for such above measurements starting from Pads 1 and 2 and moving to Pads 1 and 10. The resistance between Pads 1 and 2 was 122.604 ohms; moving from Pads 1 and 3 to Pads 1 and 10, a consistent increase in resistance of approximately 12 to 14 ohms was observed.

This value is close to an expected increase value of $R_g$ of 0.5154 ohm. Any difference is due to slightly different Au metal line thickness used in calculations and to the fact that a simplified equivalent circuit in FIG. 20 is a single cell approximation of the 40 by 40 interconnect grid.

Accordingly, described herein is a 3-D stacking and fabrication process relying on solder reflow and bonding with a photopolymerizable polymer with formation of vertical electrical interconnects between stacked substrates. Profiler evidence shows that the micro-solder bumps fabricated by reflow on a first wafer substrate and made to connect vertically with bumps on a second (top) wafer substrate are electrically viable. Electrical measurements of the vertical interconnects show that high density vertical integration may be achieved by processes described herein. When desired and preferable, described herein are various interconnect metals that form interconnect reflow simultaneous with a bonding and cure schedule.

Provided as suitable guidelines, models described herein indicate realistic interconnect dimensions for fabrication in one or more electronic device applications. For example, as guided by the high frequency analysis described previously, MEMS applications for high frequency electronics (e.g., high density) show that when the solder composition is 80% Sn/20% Au, the diameter of the interconnect is preferably about 2 microns or more, about 2 microns being the lower limit for interconnect diameter. When the solder composition is 95% Sn/5% Au, the diameter of the interconnect is preferably about 5 microns or more, about 5 microns being the lower limit for interconnect diameter. For device applications involving electro-thermal MEMS (e.g., high current), when the solder composition is 80% Sn/20% Au, the diameter of an interconnect is preferably about 5 microns or more, about 5 microns being the lower limit for interconnect diameter. When the solder composition is 95% Sn/5% Au, the diameter of an interconnect is preferably about 15 microns or more, about 15 microns being the lower limit for interconnect diameter.

Stacked structures of more than two wafer/substrate units (e.g., MEMS, fluidics, application specific integrated circuits [ASIC]) will require fabrication of electrical vias through a middle wafer(s) to be integrated with processes described here. As such, microsystems are initially fabricated according to their desired design specifications; base metal pads may be designed into the fabrication process to provide solder reflow positions. Bonding and solder reflow between microsystems proceeds similarly to steps described herein. Multiple microsystems are thus vertically stacked, an example of which is depicted in FIG. 26. Fluidic MEMS layer 2604 is prepared on a silicon-containing substrate, such as silica wafer, silicon on insulator substrate which may or may not be photosensitive. Another of MEMS layer 2608 may be similarly prepared. An ASIC layer may be for fluidics 2606 and/or high frequency MEMS 2610. The layers are stacked on a suitable silicon-containing substrate (silica wafer, glass, ceramic). MEMS layers may include micromechanical devices for an entire system; they may be further sealed individually or in compartments by a glue as described herein. Electronic layers may include low power, high frequency circuitry, such as those useful for electrostatic and radio frequency MEMS. In addition, an electronic layer may include higher power, lower frequency electronics necessary for operation of less sensitive MEMS devices (e.g., pumps, valves, thermal MEMS). Microfluidics layers may assist in thermal management of the package, for micro-air conditioning and environmental control within the package. The control may be passive include additional outside activity via fluidic microchannels (e.g., vacuum pumping, introduction of forming gases). These multisystem structures are suitable for level-0 packaging of actual MEMS devices.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed is:

1. A method for forming a three dimensional stacked structure, the method comprising:
    forming and patterning a first polymer layer onto a first surface of a first substrate, using a first polymer which is thermally compressible;
    adding one or more first conductive materials to the first surface of the first substrate to form a layer with a thickness smaller than the thickness of the first polymer layer and wherein the layer of the one or more first conductive materials, at least partially, will not cover the first polymer layer during a bonding step;
    forming and patterning a second polymer layer on a second surface of a second substrate, using a second polymer which is thermally compressible;
    adding one or more second conductive materials onto the second surface of the second substrate to form a layer with a thickness smaller than the thickness of the second polymer layer and wherein layer of the one or more second conductive materials, at least partially, will not cover the second polymer layer during the bonding step;
    aligning the first conductive materials on the first surface of the first substrate against the second conductive materials on the second surface of the second substrate;
    bonding the first polymer layer on the first substrate with the second polymer layer on the second substrate, by heating the substrates to a bonding temperature and by applying sufficient bonding pressure, to produce a bonded pair of substrates; and
    forming at least one vertical interconnect between the first and second substrates, by heating the first and second substrates to a reflow temperature of the first and second conductive materials and reflowing the first and second conductive materials.

2. The method as recited in claim 1, wherein the bonding temperature and the reflow temperature are the same, such that bonding and reflow are performed simultaneously.

3. The method as recited in claim 1, wherein the bonding temperature is less than the reflow temperature, such that bonding is performed prior to reflow.

4. The method as recited in claim 1, wherein at least one of the first and second polymers is benzocyclobutene.

5. The method as recited in claim 1, wherein the reflow temperature is greater than a minimum curing temperature and less than glass transition temperatures of both the first and second polymers.

6. The method as recited in claim 1, wherein the first one or more conductive materials comprise two or more conductive materials.

7. The method as recited in claim 6, wherein the first or more conductive materials is a combination of metals selected from the group consisting of tin, silver, gold, copper, bismuth, indium, platinum and chromium.

8. The method as recited in claim 1, wherein at least one of the first and second polymer layers is at least 3 microns thick.

9. The method as recited in claim 1, wherein the diameter occupied by at least one of the first and second conductive materials is greater than about 1 micron.

10. The method as recited in claim 1, wherein the height of the vertical interconnect is about 5 microns.

11. The method as recited in claim 1, wherein the vertical interconnect has a diameter of 1 micron or more.

12. The method as recited in claim 1, wherein at least one of the first conductive materials and the second conductive materials are 80% tin and 20% gold, added as alternate layers or as an alloy.

13. The method as recited in claim 1, wherein each polymer is sufficiently viscous to prevent reflow into an interconnect void during bonding.

14. The method as recited in claim 1, further comprising:
    depositing a first base metal pad on the first surface of the first substrate prior to depositing the first conducting materials on the first surface of the first substrate, so that the first base metal pad will be beneath at least a portion of the first conducting materials when the first conducting materials are deposited on the first surface of the first substrate;
    depositing a second base metal pad on the second surface of the second substrate prior to depositing the second conducting materials, so that the second base metal will be beneath at least a portion of the second conducting materials when the second conducting materials are deposited on the second surface of the second substrate; and
    wherein the first and second base metal pads provide adhesion and electrical connectivity with the first and second substrates, respectively.

15. A method of forming a three dimensional stacked structure with electrical interconnects, the method comprising:
    forming on a first wafer one or more first photolithographically patternable bonding material areas and one or more first conductive material areas, wherein the first conductive materials are comprised of one or more metals;

forming on a second wafer one or more second photolithographically patternable bonding material areas and one or more second conductive material areas, wherein the second conductive materials are comprised of one or more metals;

aligning the first wafer against the second wafer, such that the areas of the first and second conductive materials are substantially aligned; and applying sufficient pressure and temperature to bond the first and second wafers together and reflow the first and second conductive materials to form conductive interconnects between the first and second wafers, wherein the temperature is greater than a minimum curing temperature and less than a glass transition temperature of the bonding material.

16. The method as recited in claim 15, wherein at least one of the first or second bonding material is a benzocyclobutene.

17. The method as recited in claim 15, wherein at least one of the first or second conductive materials includes 95% tin and 5% gold, provided in alternate layers.

18. The method as recited in claim 15, further comprising:
depositing a first base metal, to form a first base metal pad, on the first wafer prior to depositing the one or more first conducting materials on the first wafer, so that the first base metal pad will be beneath at least a portion of the one or more first conducting materials when the one or more first conducting materials are deposited on the first wafer;

depositing a second base metal, to form a second base metal pad, on the second wafer prior to depositing the one or more second conducting materials, so that the second base metal pad will be beneath at least a portion of the one or more conducting materials when the one or more second conducting materials are deposited on the second wafer; and wherein the first and second base metal pads provide adhesion and electrical connectivity with the first and second substrates, respectively.

19. A method for forming a substrate structure, the method comprising:
forming and optionally patterning a first photoresist layer onto a first surface of a first substrate;
depositing a first base metal on the first photoresist layer and the first surface of the first substrate;
removing the first photoresist layer, leaving the first base metal exposed on the first surface of the first substrate;
depositing a first layer of a polymer on the first surface of the first substrate, using a first thermally compressible polymer, wherein the first layer of polymer is exposed, patterned and developed to define a first area for substrate bonding;
forming and optionally patterning a second photoresist layer onto the first surface of the first substrate and first polymer layer, leaving the base metal exposed;
depositing a first solder metal on top of the second photoresist layer and the exposed first base metal, wherein thickness of the deposited first solder metal is not as great as thickness of the first layer of polymer;
removing the second photoresist layer;
forming and optionally patterning a third photoresist layer onto a second surface of a second substrate;
depositing a second base metal on the third photoresist layer and the second surface of the second substrate;
removing the third photoresist layer, leaving the second base metal exposed on the second surface of the second substrate;
depositing a second layer of polymer onto the second surface of the second substrate, using a second thermally compressible polymer, wherein the second layer of polymer is exposed, patterned and developed to define a second area of substrate bonding;
forming and optionally patterning a fourth photoresist layer onto the second surface of the second substrate, leaving the second base metal exposed;
depositing a second solder metal on top of the fourth photoresist layer and the exposed second base metal, wherein thickness of the deposited second solder metal is not as great as thickness of the second layer of polymer;
removing the fourth photoresist layer;
aligning the first substrate with the second substrate so that the first solder metal on the first substrate is aligned with the second solder metal on the second substrate and the first polymer layer on the first substrate is aligned with the second polymer layer on the second substrate;
bonding the first polymer layer on first substrate with the second polymer layer on the second substrate to produce a bonded pair of substrates, by applying sufficient bonding pressure and heat; and
forming at least one vertical interconnect by heating the first substrate and the second substrate to a reflow temperature of the first and second solder metals and reflowing the first solder metal and the second solder metal together, wherein the vertical interconnect is connected to both the first base metal of the first substrate and the second base metal of the second substrate.

20. The method of claim 19, wherein at least one of the first or second solder metals is deposited by evaporating alternate layers of desired metals using an electron beam device.

21. The method of claim 19, wherein at least one of the first or second solder metals is deposited by evaporating alternate layers of desired metals using a thermal evaporator.

22. The method of claim 19, wherein at least one of the first or second base metals is selected from the group of titanium, platinum and chromium.

23. The method of claim 19, wherein one or more of the solder metals is selected from two or more of the following metals: tin, silver, gold, copper, bismuth, indium, platinum and chromium.

24. The method of claim 19, wherein at least one of the first or second polymer layers comprises benzocyclobutene.

25. The method of claim 19 wherein the step of forming at least one vertical interconnect by heating the first substrate and the second substrate to a reflow temperature and reflowing the first solder metal and the second solder metal together, does not come before the step of bonding the first polymer layer on first substrate with the second polymer layer on the second substrate to produce a bonded pair of substrates.

26. The method of claim 19, wherein at least one of the first or third photoresist layers comprises a positive photoresist layer.

27. The method of claim 19, wherein the first and second substrates are wafers.

28. A method for forming a substrate structure, the method comprising:
depositing a first layer of a first thermally compressive polymer on the first surface of the first substrate, wherein the first layer of polymer defines a first area of substrate bonding;

depositing a first base metal on the first surface of the first substrate;

forming and optionally patterning a first photoresist layer onto the first surface of the first substrate and first polymer layer, leaving the base metal exposed;

depositing a first solder metal on top of the first photoresist layer and the exposed first base metal, wherein the first solder metal is not deposited as thickly as the first layer of polymer;

removing the first photoresist layer, including any first solder metal on top of the first photoresist layer;

depositing a second layer of a second thermally compressive polymer onto the second surface of the second substrate, wherein the second layer of polymer defines a second area of substrate bonding;

depositing a second base metal on the second surface of the second substrate;

forming and optionally patterning a second photoresist layer onto the second surface of the second substrate, leaving the second base metal exposed;

depositing a second solder metal on top of the second photoresist layer and the exposed second base metal, wherein the second solder metal is not deposited as thickly as the second layer of polymer;

removing the second photoresist layer, including any second solder metal on top of the second photoresist layer;

aligning the first substrate with the second substrate so that the first solder metal on the first substrate is aligned with the second solder metal on the second substrate and the first area of wafer bonding on the first substrate is aligned with the second area of wafer bonding on the second substrate;

bonding the first polymer layer on first substrate with the second polymer layer on the second substrate to produce a bonded pair of substrates by applying sufficient heat and pressure; and reflowing the first solder metal and the second solder metal together to form at least one vertical interconnect by heating the first substrate and the second substrate to a reflow temperature of the first and second solder metals, wherein the vertical interconnect is connected to the first base metal of the first substrate and the second base metal of the second substrate.

29. The method of claim 28, wherein the step of depositing the first layer of polymer on the first surface of the first substrate includes the sub-steps of spin coating, soft baking, exposing and pre-development baking.

30. The method of claim 28, wherein the first and second substrates are wafers.

* * * * *